(12) United States Patent
Nose et al.

(10) Patent No.: US 11,488,669 B2
(45) Date of Patent: Nov. 1, 2022

(54) THREE-VALUED PROGRAMMING MECHANISM FOR NON-VOLATILE MEMORY STRUCTURES

(71) Applicant: SanDisk Technologies LLC, Addison, TX (US)

(72) Inventors: Keiji Nose, Kanagawa (JP); Hiroki Yabe, Kanagawa (JP); Masahiro Kano, Kanagawa (JP); Yuki Fujita, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 119 days.

(21) Appl. No.: 17/136,828

(22) Filed: Dec. 29, 2020

(65) Prior Publication Data

US 2022/0208270 A1    Jun. 30, 2022

(51) Int. Cl.
| | |
|---|---|
| *G11C 7/00* | (2006.01) |
| *G11C 16/10* | (2006.01) |
| *G11C 16/26* | (2006.01) |
| *G11C 16/30* | (2006.01) |
| *G11C 16/24* | (2006.01) |
| *G11C 16/08* | (2006.01) |

(52) U.S. Cl.
CPC .............. *G11C 16/10* (2013.01); *G11C 16/08* (2013.01); *G11C 16/24* (2013.01); *G11C 16/26* (2013.01); *G11C 16/30* (2013.01)

(58) Field of Classification Search
CPC .......... G11C 8/16; G11C 7/22; G11C 7/1075; G11C 7/1006; G11C 7/1051
USPC ....................... 365/189.04, 185.08
See application file for complete search history.

(56) References Cited

U.S. PATENT DOCUMENTS

2006/0023539 A1*   2/2006   Nakai ................... G11C 7/067
                                                                                365/207
2017/0200501 A1*   7/2017   Yang ..................... G11C 16/10

* cited by examiner

*Primary Examiner* — Son T Dinh
(74) *Attorney, Agent, or Firm* — Dickinson Wright PLLC; Steven C. Hurles

(57) ABSTRACT

A method for programming three page user data in a memory array of a non-volatile memory system, comprising converting each three-bit value data pattern of the user data into a representative pair of two-bit data values, simultaneously programming two single-state memory cells with a first of the pair of representative two-bit data values, wherein the two single-state memory cells are located along a first common word line of two memory cell strings, and simultaneously programming two single-state memory cells with a second of the pair of representative two-bit data values, wherein the two single-state memory cells are located along a second common word line of the two memory cell strings.

20 Claims, 23 Drawing Sheets

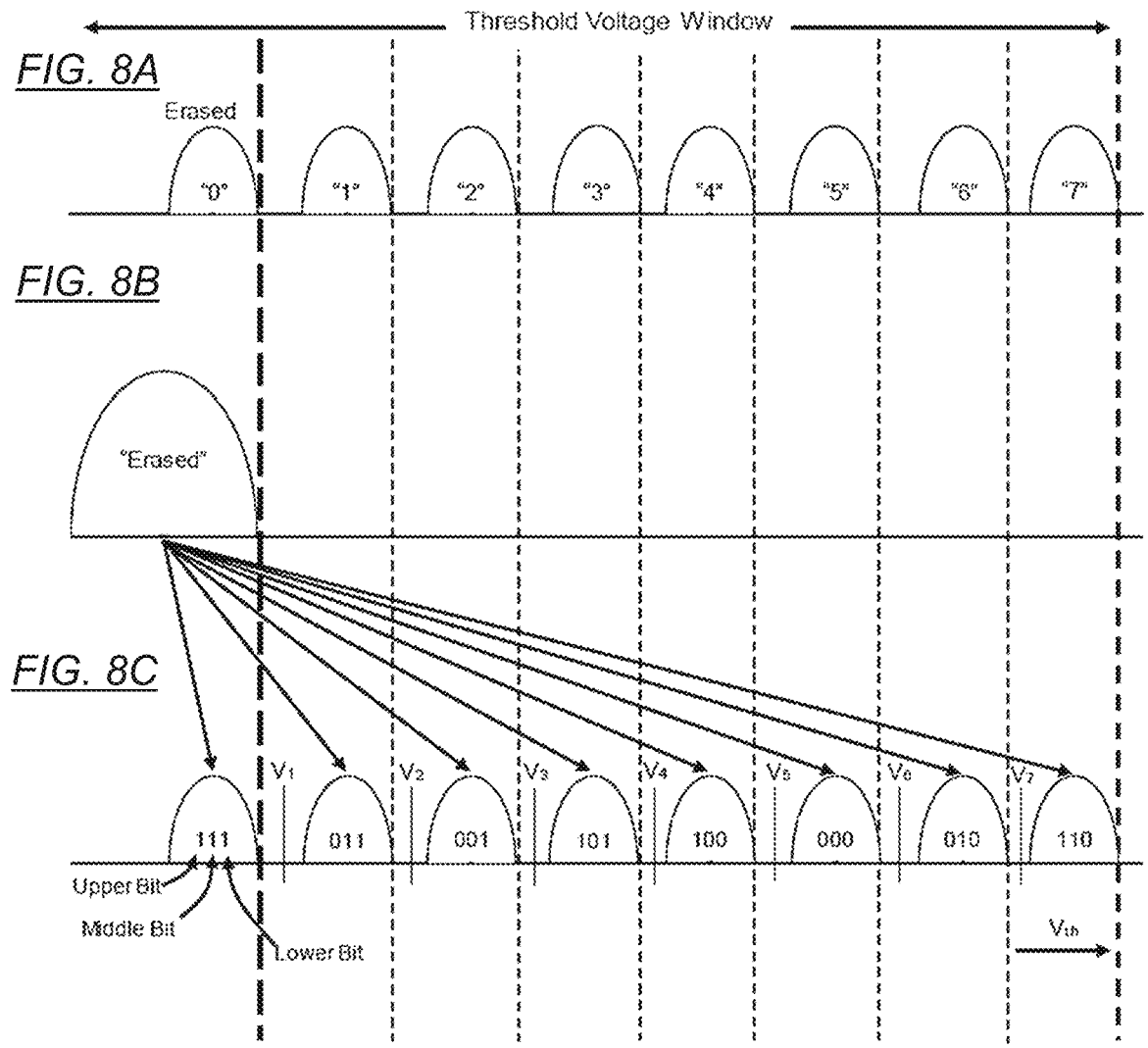

THREE-VALUED PROGRAMMING MECHANISM FOR NON-VOLATILE MEMORY STRUCTURES

TECHNICAL FIELD

This disclosure relates to non-volatile memory storage systems in solid-state drives or other devices, including but not limited to flash drives or embedded/removable flash packages. More specifically, this disclosure relates to systems and methods for programming non-volatile memory structures.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices.

With respect to some flash memory types, each individual memory cell comprises a floating gate that is positioned above and isolated from a channel region of a semiconductor substrate, wherein the floating gate is positioned between the source and drain regions. Also, a control gate is provided over and isolated from the floating gate. Accordingly, the threshold voltage ($V_{th}$) of the resulting transistor is controlled by and dependent on the amount of charge retained on the floating gate. Specifically, in a switch-like manner, the minimum amount of voltage that must be applied to the control gate before the transistor is activated to permit conduction between its source and drain is determined by the level of charge retained on the floating gate. As a result, bit-value data can be programmed onto and erased from the memory cell by changing the level of charge on a floating gate in order to change the threshold voltage characteristic of the transistor.

As explained in detail below, the number of bits that can be stored in an individual memory cell is dependent upon the number of distinct voltage ranges that may be partitioned within the threshold voltage window of that memory cell. For example, to store one bit of data (referred to as a binary data), the possible threshold voltages ($V_{th}$) of the memory cell are divided into two ranges, wherein the ranges are assigned as logical data "1" and "0" respectively. A memory cell of this type of storage density may be referred to as a "single-level cell" or SLC.

By further partitioning the threshold voltage window of a memory cell into additional distinct voltage ranges, multiple levels of information may be stored. Such a memory cell may be referred to as a "multi-state cell." For example, to store two bits of data, the threshold voltage window of a cell may be partitioned into four distinct voltage ranges (or states), wherein each range is assigned a bit value equal to, for example, "11," "10," "01," and "00." Accordingly, after an erase operation, the threshold voltage is negative and may be defined as logic "11." As such, the positive threshold voltages are used for the states of "10," "01, "00." A memory cell of this storage density may be referred to as a "multi-level cell" or MLC. In a further example, in order to store three bits of data, the voltage threshold window of a cell may be partitioned into eight distinct voltage ranges (or states), with each range being assigned a bit value that is equal to, for example, "111," "110," "100," "010," "011," "000," "001," and "101." A memory cell of this storage density may be referred to as a "tri-level" or "triple-level cell" (TLC). The specific relationship between the data that is programmed into a memory cell and the threshold voltage levels of the memory cell depends upon the data encoding scheme that is adopted for the memory cells.

Thus, a memory device that comprises multi-state data (by incorporating MLC and/or TLC-type cells) has an increased storage capacity using the same MOSFET structure and wafer size as an SLC-type cell and, as a result, provides a comparative cost per bit savings. However, as a consequence of the increased density and the tightened tolerances between the partitioned voltage ranges of multi-state memory cells, programming occurs at a slower speed relative to a single-state memory cell because the data is programmed to multiple target threshold voltage ranges and requires a higher level of precision during programming. The increased density of a multi-state memory cell decreases the margin of error between state changes and reduces the available voltage range capacity needed to endure the stress on the silicon oxide layer over the successive programming/erase cycles. As a result, in comparison to a single-state memory cell, the durability of a multi-state storage element is significantly lower. Therefore, with respect to some applications, a memory system exclusively comprising single-state memory cells is best suited. However, in other applications, there exists technologies that employ memory die that store data primarily in memory cells storing multi-state data. In addition, in some memory systems, data is first programmed to a cache (using one or more data latches) of single-state memory cells storing binary data in order to take advantage of the faster speed of programming these memory cells. Subsequently, while the memory system is idle or busy with other data operations, the cache of single-state memory cells that are storing binary data then transfers the stored data to multi-state memory cells that store multi-state data, thus taking advantage of the larger storage capacity that is provided by the multi-state memory cells. This beneficial mechanism for transferring data from single-state memory cells to multi-state memory cells is known in the industry as a "folding" operation and is described in detail below. Accordingly, a plurality of data latches may be employed in a flash memory system that programs data to the single-state memory cells and, in some cases, to multi-state memory cells.

However, although the use of internal "folding" operations to program higher density memory storage devices improves the programming speed (and, hence, overall performance) of the memory device, the fact that a "folding" operation still requires at least two stages (i.e., the initial programming to the single-state memory cells and the subsequent rewriting to the multi-state memory cells) adds complexity and processing time to the memory device operations. Accordingly, it would be beneficial to be able to optimize one or both of the stages to further improve their efficiency.

SUMMARY

Various embodiments include a method for programming three page user data in a memory array of a non-volatile memory system, wherein the method comprises converting each three-bit value data pattern of the user data into a representative pair of two-bit data values, simultaneously programming two single-state memory cells with a first of the pair of representative two-bit data values, wherein the two single-state memory cells are located along a first common word line of two memory cell strings, and simultaneously programming two single-state memory cells with a second of the pair of representative two-bit data values, wherein the two single-state memory cells are located along a second common word line of the two memory cell strings. Further, the two memory cell strings may be located adjacent, or in relatively close physical proximity, to each other.

Other embodiments include a memory controller comprising a first port configured to couple to a non-volatile memory structure, wherein the memory structure comprises a memory array. The memory controller is configured to convert each three-bit value data pattern of a three page set of user data into a representative pair of two-bit data values, simultaneously program two single-state memory cells with a first of the pair of representative two-bit data values, wherein the two single-state memory cells are located along a first common word line of two memory cell strings of the memory array, and simultaneously program two single-state memory cells with a second of the pair of representative two-bit data values, wherein the two single-state memory cells are located along a second common word line of the two memory cell strings. Further, the two memory cell strings may be located adjacent, or in relatively close physical proximity, to each other.

Additional embodiments include a non-volatile memory system that is comprised of a memory array, and a memory controller coupled to the memory array and converting each three-bit value data pattern of a three page set of user data into a representative pair of two-bit data values, simultaneously programming two single-state memory cells with a first of the pair of representative two-bit data values, wherein the two single-state memory cells are located along a first common word line of two memory cell strings of the memory array, and simultaneously programming two single-state memory cells with a second of the pair of representative two-bit data values, wherein the two single-state memory cells are located along a second common word line of the two memory cell strings. Further, the two memory cell strings may be located adjacent, or in relatively close physical proximity, to each other.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIGS. 8A-8C depict stages of programming eight states of a population of TLC-type memory cells, in accordance with exemplary embodiments;

DETAILED DESCRIPTION

Figure 1:
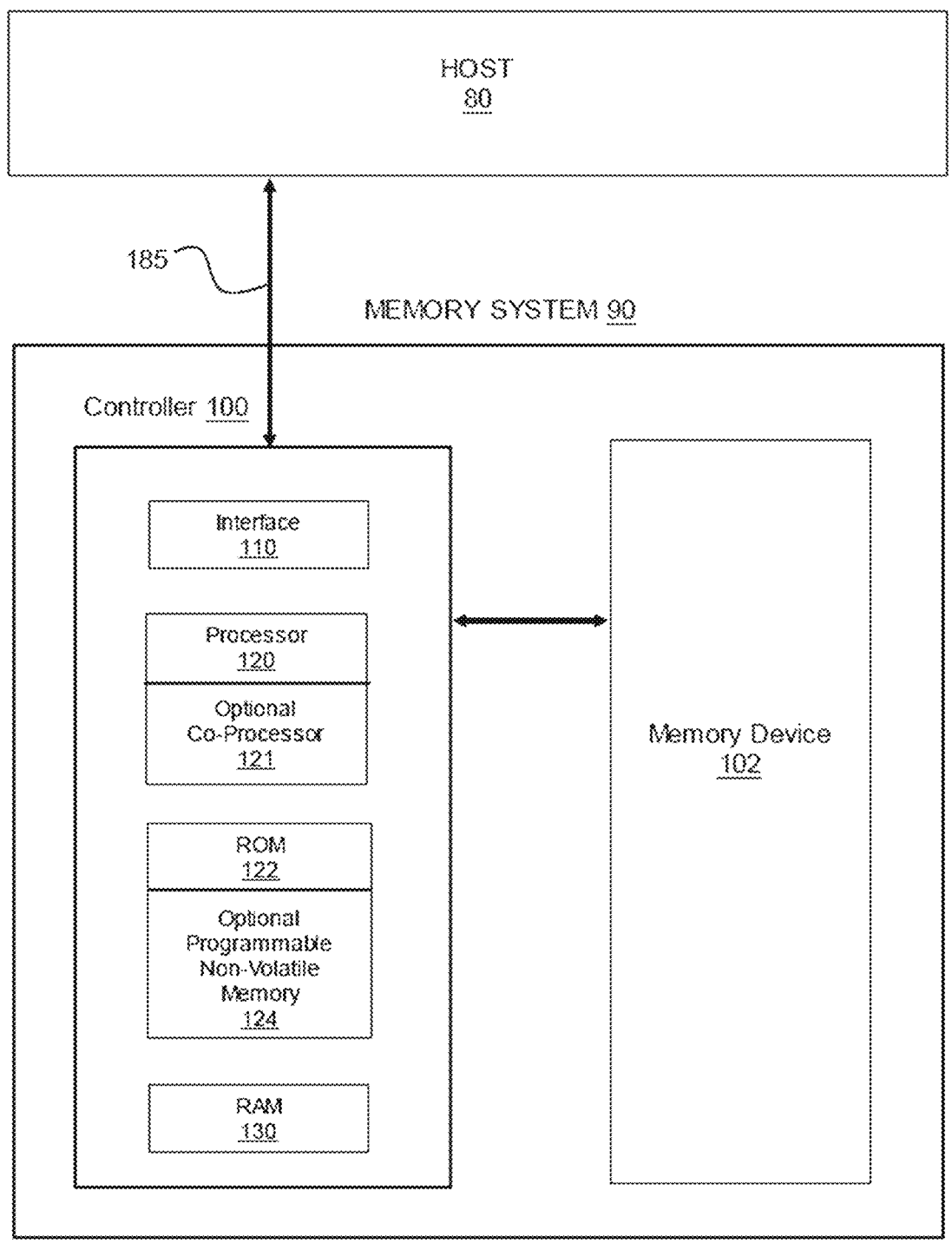
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Thus, methods and means for these functions are described herein. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as used herein, refer to a sequence of instructions designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions designed for execution on a computer system.

Additionally, the terms "couple," "coupled," or "couples," where used herein, are intended to mean either a direct or an indirect connection. Thus, if a first device couples, or is coupled to, a second device, that connection may be by way of a direct connection or through an indirect connection via other devices (or components) and connections.

Regarding the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

Various elements of the present disclosure are described below with reference to schematic flowchart diagrams and/or schematic block diagrams depicting methods, apparatuses, systems, and computer program processes according to exemplary embodiments of the present disclosure, wherein each block, or combinations of blocks, of the schematic flowchart and/or schematic block diagrams, can be implemented by specifically-written computer program instructions. As is understood in the art, the computer program instructions are executed by a designated processor of a computer or other programmable data processing apparatus, thereby creating the mechanisms for implementing the functions, acts, and/or operations specifically set forth in the one or more blocks of the schematic flowchart and/or schematic block diagrams. Further, it is noted that, in certain alternative process implementations, the functions specified in a block may occur out of the precise order depicted in the schematic flowchart and/or block diagrams. For example, two blocks depicted in the diagram as occurring in succession may, in fact, be executed substantially at the same time (i.e., concurrently), or even executed in a reverse order, depending upon the functionality involved. In addition, other process steps and methods that are equivalent in function, logic, or effect to one or more blocks, or portions thereof, of the diagrams may be conceived and are contemplated as being within the scope of the present disclosure. Furthermore, although the schematic diagrams may depict various arrow types and directions and line types as a matter of illustration, they are not intended to limit the scope of corresponding embodiments. For instance, an arrow may represent or signify a waiting or monitoring period of unspecified duration between enumerated steps of the depicted exemplary embodiment.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, programmable non-volatile memory 124, and additional components. The controller 100 may, for example, be in the form of one or more application-specific integrated circuits (ASIC) in which the components included in such an ASIC generally depend on the particular application.

Figure 2:
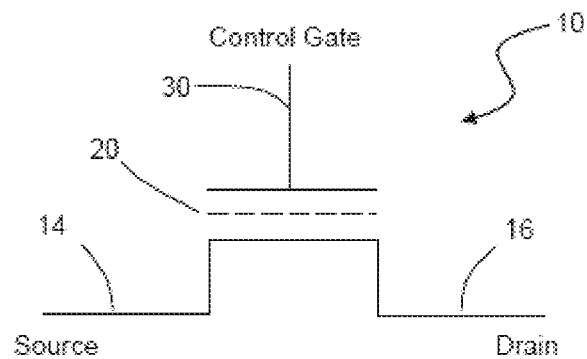
FIG. 2 is a schematic depiction of a non-volatile memory cell, in accordance with exemplary embodiments.

With respect to the memory device 102 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of the bit line.

Figure 3:
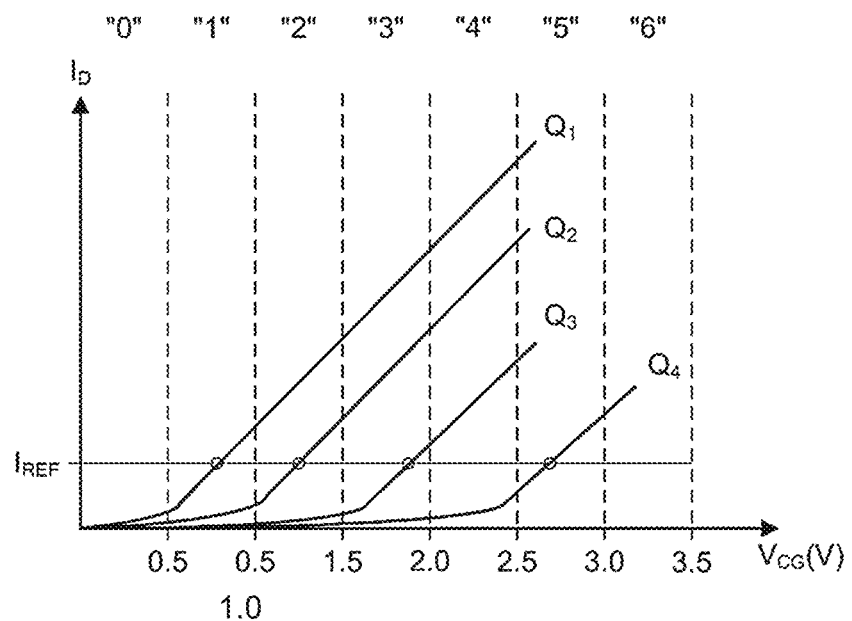
FIG. 3 depicts the relationship between a source-drain current ID and a control gate voltage $V_{CG}$ for four different charges Q1-Q4 that a floating gate of a non-volatile memory cell may be selectively storing at any one time and at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels that can be programmed on a floating gate of the memory cell, wherein the four charge levels respectively correspond to four of eight possible memory states. Therefore, as an example, the threshold voltage window of a population of memory cells may range from 0.5 V to 3.5 V. In such an example, seven programmed memory states assigned as "0," "1," "2," "3," "4," "5," "6," respectively, and one erased state (which is not shown in FIG. 3), may be demarcated by partitioning the threshold window into regions at intervals of 0.5 V each. Accordingly, if a reference current, $I_{REF}$, of 2 μA is used as shown, then a cell programmed with Q1 voltage may be considered to be in a memory state "1" as its curve intersects with $I_{REF}$ in the region of the threshold window that is demarcated by the voltage range $V_{CG}$=0.5 V and 1.0 V. Similarly, Q4 is in a memory state "5."

Thus, as mentioned above, the more states that a memory cell 10 is made to store, the more finely divided is its threshold voltage window. For example, in a memory cell 10 that has a threshold voltage window ranging from −1.5 V to 5 V, thereby providing a possible maximum width of 6.5 V, and is to store 16 memory states, each state may only occupy a voltage range of from 200 mV to 300 mV. Such a narrow voltage range will require higher precision in programming and reading operations in order to achieve the required resolution.

Figure 4A:
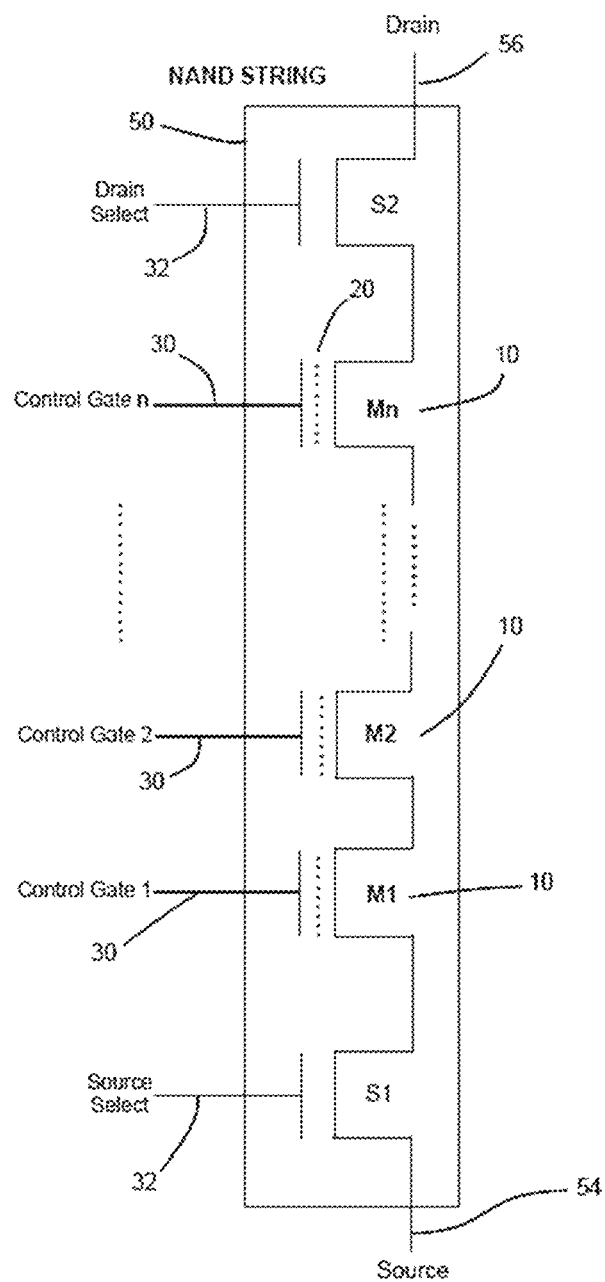
FIG. 4A schematically depicts a series of NAND-type memory cells that are organized into a string, in accordance with exemplary embodiments.

Individual memory cells 10 are organized into strings in which the memory cells are placed in series. For example, depicted in FIG. 4A is an exemplary embodiment of a string 50 comprising NAND-type memory cells in which the series of the cells' respective transistor elements M1, M2, . . . , Mn (wherein "n" may equal 4, 8, 16 or higher) are daisy-chained with respect to their sources and drains. Further, as discussed with respect to FIG. 3, each memory transistor 10 in the string 50 has a charge storage element 20 (e.g., a floating gate) for storing a certain amount of charge so as to represent an intended memory state of that cell. And, as explained in greater detail below, each memory transistor 10 comprises a control gate 30 that allows control over the read and write operations. Present at the source terminal 54 and drain terminal 56 of the string 50 are select transistors S1, S2 that control the transistor elements' connection to the outlying memory array. Specifically, when the source select transistor S1 is turned on, the source terminal 54 is coupled to a source line. Likewise, when the drain select transistor S2 is turned on, the drain terminal 56 is coupled to a bit line of the memory array.

Figure 4B:
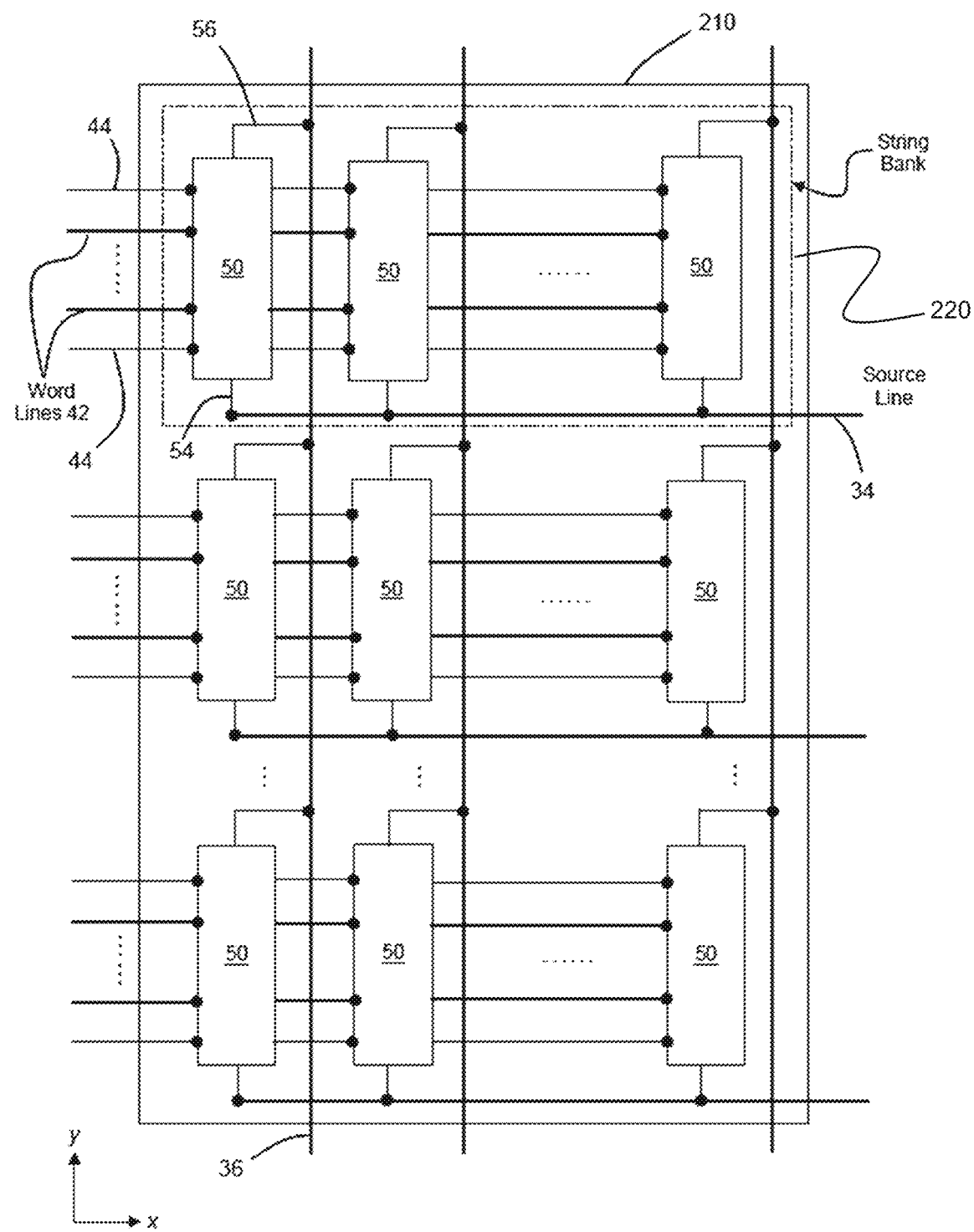
FIG. 4B schematically depicts an array of memory cells, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 210 comprised of a plurality of NAND strings 50 of the type illustrated in FIG. 4A. Along each column of NAND strings 50, a bit line 36 is coupled to the drain terminal 56 of each NAND string. In addition, along each bank of NAND strings 50, a source line 34 is coupled to the source terminals 54 of each NAND string. Further, the control gates 30 of the memory transistors 10 in a row of memory cells in the bank of NAND strings 50 are connected to the same word line 42. Accordingly, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, a conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provides control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines 42 and select lines 44 of the bank of NAND strings 50.

Figure 5:
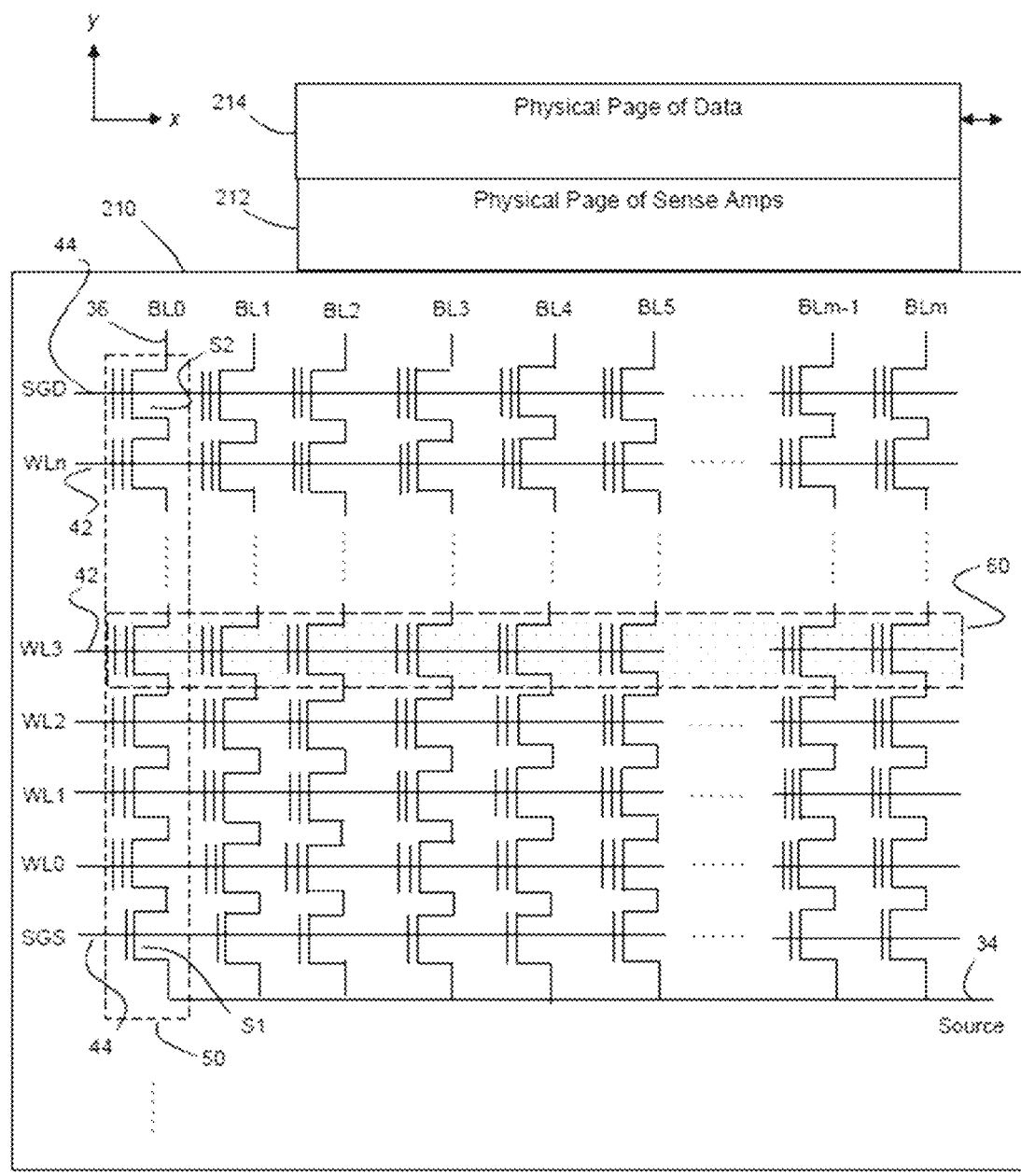
FIG. 5 depicts a page of memory cells being sensed or programmed in parallel, and in relation to a memory array organized in the NAND-type configuration, in accordance with exemplary embodiments.

Turning now to FIG. 5, there is depicted a detailed illustration of one bank of NAND strings 50 of a memory array 210 according to an exemplary embodiment thereof. This view is particularly useful in visualizing a row-by-row configuration of the memory array 210, wherein each row of the array 210 may be referred to as a "page." Accordingly, a physical page (such as page 60 denoted in FIG. 5) is a group of memory cells 10 that is enabled to be sensed or programmed in parallel. In fact, a page is the smallest unit of the memory device that may be programmed or written to. Programming of a page is accomplished by a corresponding page of sense amplifiers 212, wherein each sense amplifier may be coupled to a respective NAND string 50 via a bit line (e.g., see respective bit lines BL0, BL1, BL2, BL3, BL4, BL5, . . . , BLm−1, and BLm illustrated in FIG. 5). Thus, a page 60 is enabled by the control gates of the plurality of memory cells 10 in page 60, which are connected to a common word line 42, and each memory cell 10 of the page 60 is accessible by a sense amplifier via a bit line 36. Therefore, when programming or sensing a page 60 of memory cells 10, a programming or sensing voltage is respectively applied to the common word line (e.g., word line WL3 with respect to the page 60) together with appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page. For example, in a memory device of the SLC-type in which one bit of data is stored in each memory cell 10, one physical page 60 stores one logical page of data. Accordingly, in a memory device of the MLC-type in which two bits of data are stored in each memory cell 10, one physical page 60 can store two logical pages of data. As such, one or more logical pages of data are typically stored in one row (i.e., page 60) of memory cells. A page 60 can store one or more sectors wherein a sector is comprised of both user data and overhead data. In an exemplary embodiment, individual pages 60 may be divided into segments in which each segment contains the fewest number of memory cells 10 that may be written at one time in a basic programming operation.

Figure 6A:
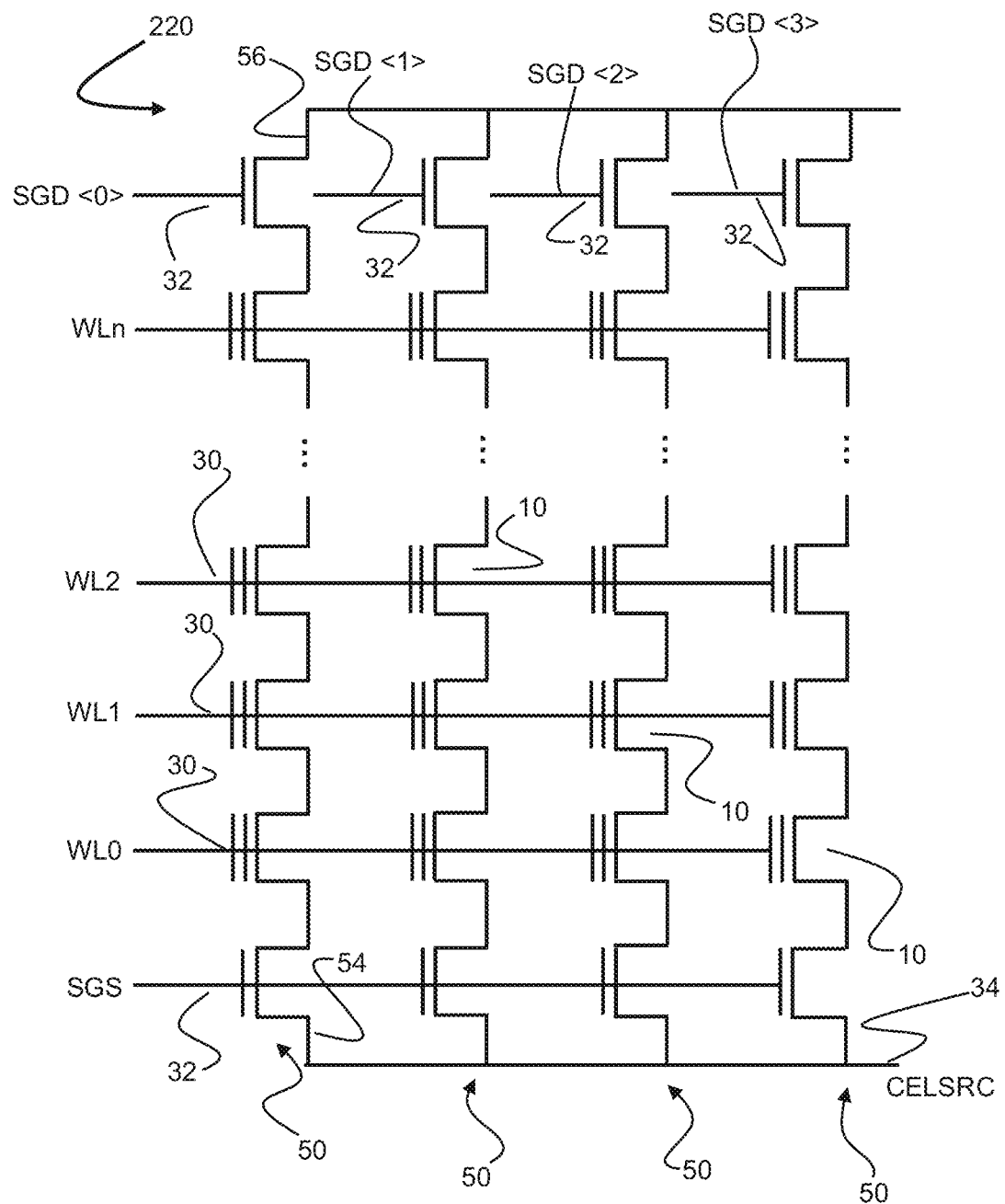
FIG. 6A schematically depicts an alternative configuration of NAND-type strings arranged in a memory block structure, in accordance with exemplary embodiments.
Figure 6B:
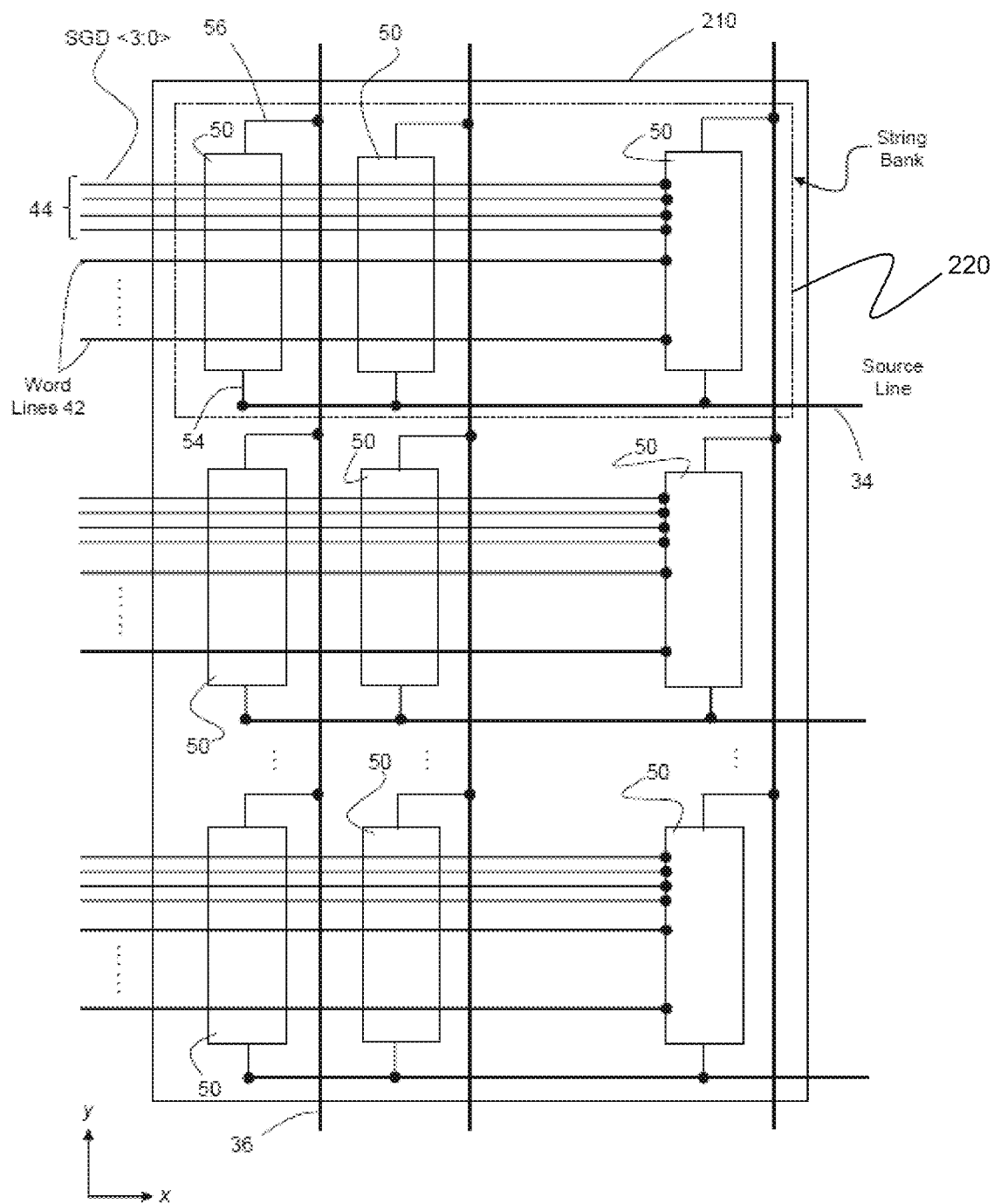
FIG. 6B schematically depicts an array of memory cells, comprising a plurality of NAND-type memory block structures, such as the type shown in FIG. 6A, in accordance with exemplary embodiments.

Referring now to FIGS. 6A and 6B, there is shown an alternative configuration of an exemplary embodiment of a memory block or bank structure 220 of a memory array 210. According to this embodiment, memory block structure 220 may be comprised of, for example, four NAND-type strings 50 that are connected in parallel such that they share the same word line (WL) connections 42. However, unlike the embodiment depicted in FIGS. 4A-4B and 5, each of the four select transistors 32 at the drain select gate (SGD) terminal is electrically coupled to a separate select line 44. As a result, each string 50 can be selected independently during memory operations, by applying the necessary biasing voltage to a respective select line 44 of a desired drain select gate (SGD). Accordingly, each string 50 belongs to a different programming page.

Figures 7A, 7B, 7C:
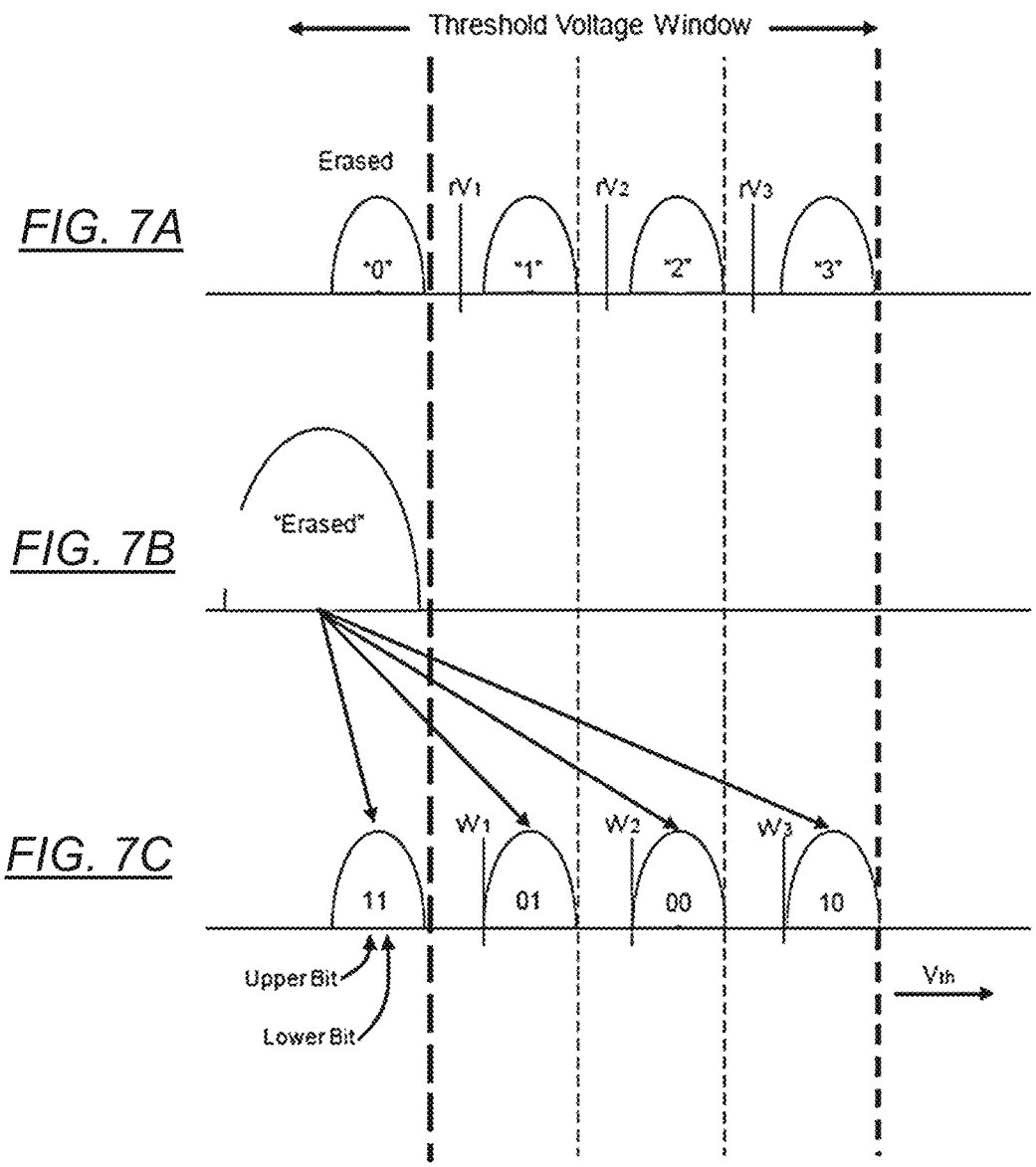
FIGS. 7A-7C depict stages of programming four states of a population of MLC-type memory cells, in accordance with exemplary embodiments.

To illustrate an exemplary embodiment of the programming stages of a MLC-type memory device comprising a population of four-state memory cells, reference is made to FIGS. 7A-7C. In FIG. 7A, there is depicted a population of memory cells in which the characteristic threshold voltage window is divided into four distinct voltage distributions wherein each distribution corresponds to a programmable memory state (i.e., memory states "0," "1," "2," and "3"). FIG. 7B illustrates an initial distribution of "erased" threshold voltages for an erased memory. In FIG. 7C, much of the memory cell population is programmed such that the initial "erased" threshold voltage of a given memory cell 10 is moved to a higher value into one of the three divided voltage zones demarcated by verify levels $vV_1$, $vV_2$, and $vV_3$. Accordingly, each memory cell can be programmed to one of the three programmable states "1," "2," and "3," or remain in the "erased" state. On a bit level, a 2-bit code having a lower bit and an upper bit can be used to represent each of the four memory states. For example, as depicted in FIG. 7C, the memory states "0," "1," "2," and "3" may be assigned bit values "11," "01," "00," and "10" respectively. In such an example, the 2-bit data may be read from the memory by sensing in a "full-sequence" mode where the two bits are sensed together by sensing relative to the corresponding read demarcation threshold voltages rV1, rV2, and rV3 in three sub-passes respectively.

Similarly, FIGS. 8A-8C illustrate programming stages of a TLC-type memory device comprising a population of eight-state memory cells, each cell being programmable into eight distinct distributions of threshold voltages that, in accordance with this particular embodiment, represent memory states "0," "1," "2," "3," "4," "5," "6," and "7," respectively (as shown in FIG. 8A). Thus, FIG. 8B depicts an initial distribution of "erased" threshold voltages for an erased memory. Further, FIG. 8C depicts an example of the memory after many of the memory cells have been programmed. As a result, a cell's threshold voltage is moved higher into one of the distinct voltage ranges demarcated by levels V1, V2, V3, V4, V5, V6, and V7. Accordingly, each memory cell can be programmed to one of the seven programmed states "1" through "7," or can remain unprogrammed in the "erased" state. As a consequence of the programming, the initial distribution of the "erased" state as shown in FIG. 8B becomes narrower as indicated by the "0" state in FIG. 8C. In this case, a 3-bit code having lower, middle, and upper bits can be used to represent each of the memory states (i.e., "111," "011," "001," "101," "100," "000," "010," and "110") and the 3-bit data may also be read from the memory by sensing in the "full-sequence" mode where the three bits are sensed together by sensing relative to the demarcation threshold values V1 through V7 in seven sub-passes respectively.

Figure 9:
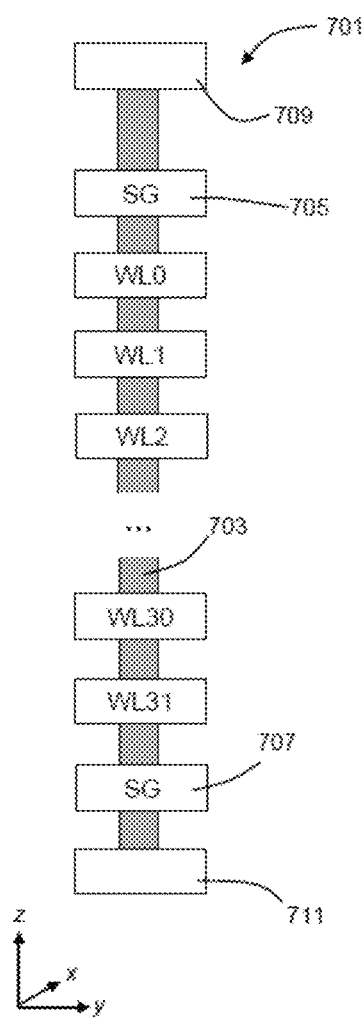
FIG. 9 depicts a vertical NAND-type string in accordance with an exemplary embodiment.

In FIGS. 4A-4B, 5 and 6A-6B and the foregoing corresponding discussion, there is generally described a two-dimensional (or planar) memory array 210 (lying in a x-y plane, for example), which may comprise NAND-type memory cells. However, in an alternative configuration, a memory array may be in the form of a three-dimensional memory array that, unlike being formed on a planar surface of a semiconductor substrate or wafer, the array extends upwards from the wafer surface and comprises stacks or columns of memory cells extending vertically in an upwards direction (for example, in a z direction that is perpendicular to the x-y plane). For example, illustrated in FIG. 9 is an exemplary embodiment of a NAND-type string 701, which is operated in a similar manner as a planar two-dimensional NAND-type string (such as the NAND-type string 50 described above). According to this configuration, a memory cell is formed at the juncture of a vertical bit line (see e.g., local bit line 703) and a word line (see e.g., word lines WL0, WL1, etc.), wherein a charge trapping layer located between the local bit line 703 and an intersecting word line stores charge (which dictates the threshold voltage of the transistor formed by the word line—gate—coupled to the vertical bit line—channel—that it encircles). To form a vertical string 701, stacks of word lines are formed and memory holes are etched at the appropriate locations where cells are to be formed, wherein each memory hole is lined with a charge trapping layer and filled with a suitable local bit line/channel material. Dielectric layers are included for the necessary isolation. Further, located at either end of the NAND-type string 701 are select gates 705, 707, which allow for the selective connection to, or isolation from, external elements 709, 711 that include, for example, conductive lines such as common source lines or bit lines that serve large numbers of strings 701 of an array. In the particular embodiment illustrated in FIG. 9, the vertical NAND-type string 701 has 32 memory cells (i.e., at the juncture between local bit line 703 and word lines 0 through 31) connected in series. However, a NAND-type string 701 may comprise any suitable number of memory cells.

Figure 10:
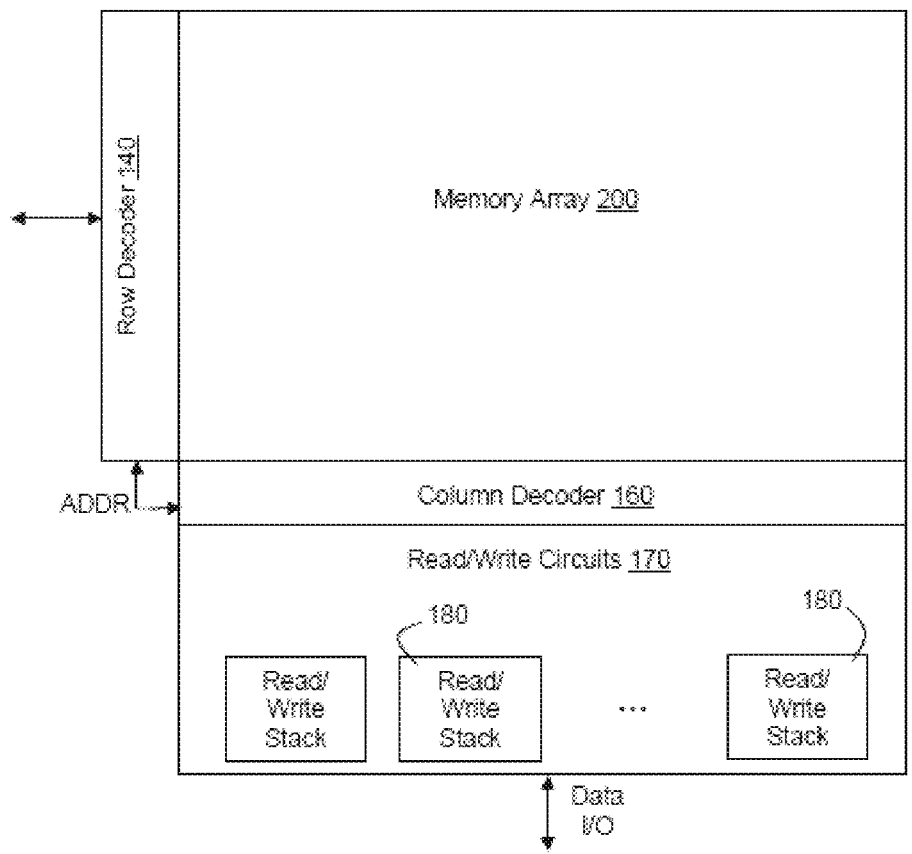
FIG. 10 schematically depicts a configuration of a non-volatile memory array that is accessible by read/write circuits via row and column decoders, in accordance with exemplary embodiments.
Figure 11:
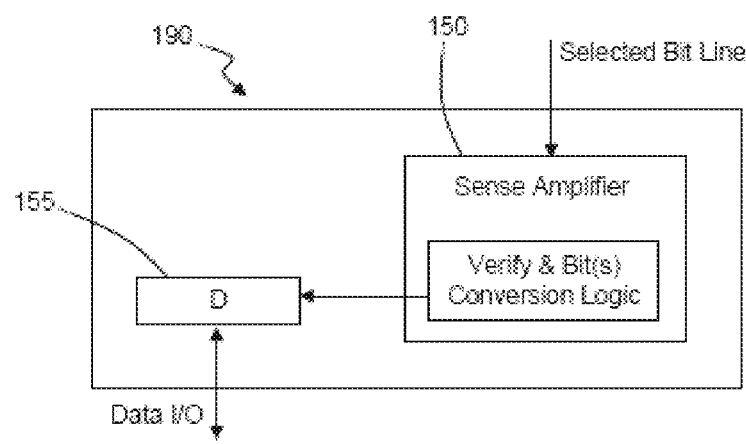
FIG. 11 is a block diagram of an individual read/write module, in accordance with an exemplary embodiment.

Referring back to the overall architecture of a memory system that is, for example, depicted in FIG. 1, a schematic depiction of a typical arrangement of a memory array of such a system is illustrated in FIG. 10. In this exemplary embodiment, there is shown a non-volatile memory array 200 that is accessible by read/write circuits 170 by way of row decoder 140 and column decoder 160. As previously described above, individual memory cells of the memory array 200 are addressable via a set of selected word line(s) and bit line(s). Accordingly, the row decoder 140 selects one or more word lines and the column decoder 160 selects one or more bit lines in order to apply the appropriate voltages to the respective gates of the addressed memory cells. Further, read/write circuits 170 are provided to read or write the memory states of the addressed memory cells, wherein the read/write circuits 170 comprise a number of read/write modules connectable via bit lines to the memory elements of the array 200. A schematic block diagram of such a read/write module 190 is provided in FIG. 11, according to an exemplary embodiment thereof. In operation, during a read or verify step, a sense amplifier 150 determines the current that is flowing through the drain of an addressed memory cell that is connected via a selected bit line. The level detected by the sense amplifier 150 is converted by a level-to-bits conversion logic to a set of data bits to be stored in a data latch 155. Now referring back to FIG. 10, the read/write circuits 170 are organized into banks of read/write stacks 180 wherein each read/write stack 180 is a stack of read/write modules 190.

Figure 12A:
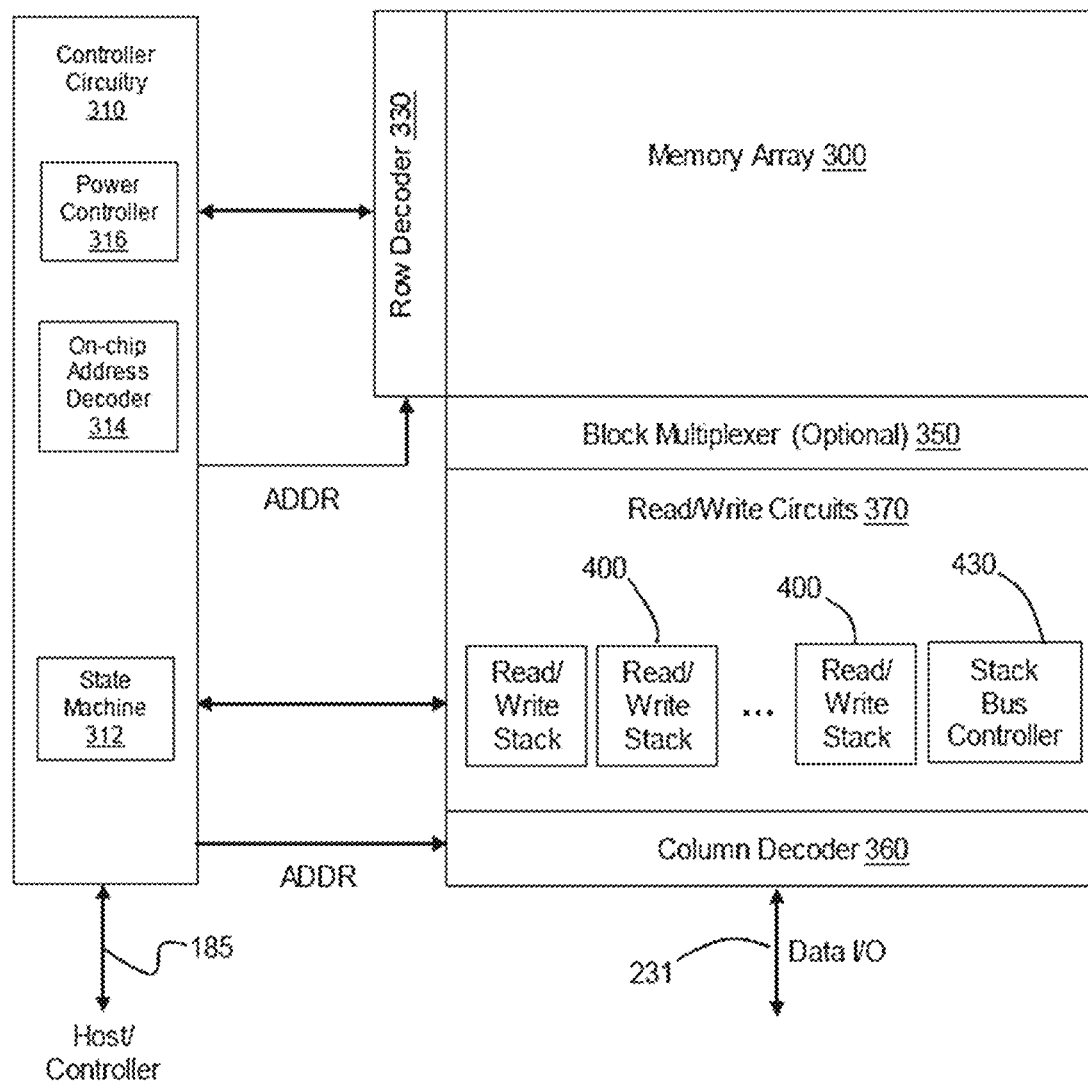
FIG. 12A schematically depicts a memory device with a bank of partitioned read/write stacks, in accordance with exemplary embodiments.

Referring now to FIG. 12A, there is shown an exemplary embodiment of a memory device (such as memory device 102 in FIG. 1, for example) comprised of a non-volatile memory array 300 (which may include NAND-type SLC, MLC, TLC, and/or QLC memory cells that are in a two- or three-dimensional configuration), control circuitry 310, and read/write circuits 370. Further, as is depicted, read/write circuits 370 are comprised of one or more banks of partitioned read/write stacks 400, thereby allowing a block (or "page") of memory cells to be read or programmed in parallel wherein, according to an exemplary embodiment, a "page" of memory cells constitutes a contiguous row of memory cells. Memory array 300 is addressable by word lines via row decoder 330 and by bit lines via column decoder 360. Alternatively, the memory array 300 may comprise rows of memory cells that are partitioned into multiple blocks or pages. Hence, in such an exemplary embodiment, a block multiplexer 350 is provided to multiplex the read/write circuits 370 to the individual blocks.

With respect to the control circuitry 310, it operates in conjunction with the read/write circuits 370 to perform memory operations on the memory array 300. In this particular embodiment, the control circuitry 310 includes a state machine 312, an on-chip address decoder 314, and a power controller 316. The state machine 312 provides chip level control of memory operations. The on-chip decoder 314 provides an address interface between that that is used by the host or a memory controller to the hardware address used by the decoders 330, 360. Lastly, the power controller 316 controls the power and voltages that are supplied to the word lines and bit lines during memory operations.

Figure 12B:
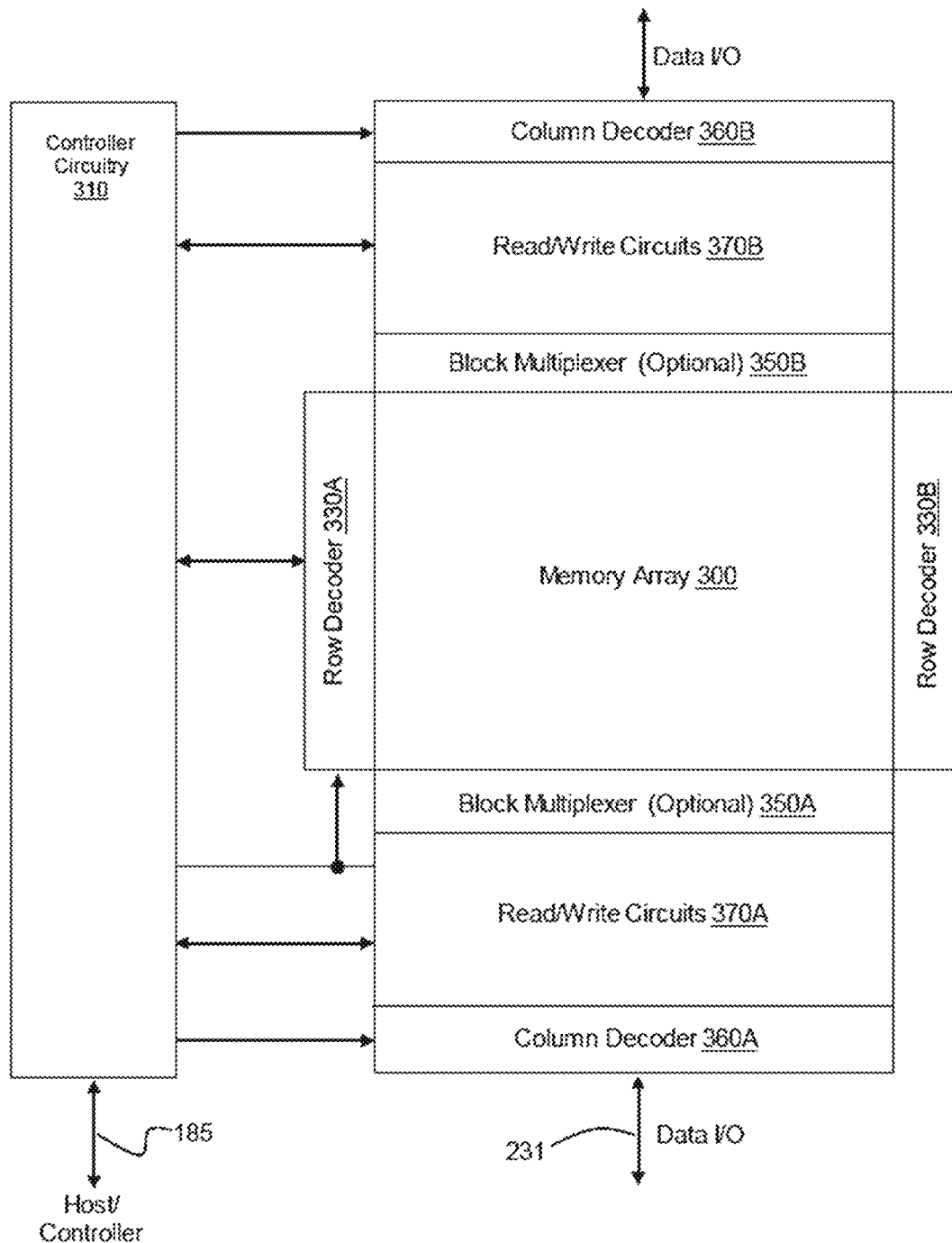
FIG. 12B schematically depicts the memory device of FIG. 12A in a slightly different configuration, in accordance with exemplary embodiments.

FIG. 12B depicts a slightly different exemplary embodiment of the memory device of FIG. 12A. In this particular embodiment, access to memory array 300 by the various peripheral circuits is implemented in a symmetrical manner on opposite sides of the memory array 300. As a result, the access lines and circuitry on each side of the memory array 300 are reduced in half when compared to the configuration in FIG. 12A. Specifically, the row decoder 330 is split into multiple row decoders 330A, 330B, and the column decoder 360 is split into multiple column decoders 360A, 360B. Furthermore, in such an embodiment in which a row of memory cells is partitioned into multiple blocks, block multiplexer 350 is split into multiple block multiplexers 350A, 350B. The read/write circuits 370 are likewise divided into read/write circuits 370A (connecting to bit lines from the bottom of memory array 300) and read/write circuits 370B (connecting to bit lines from the top of memory array 300). Accordingly, the density of the read/write modules (as well as the partitioned read/write stacks 400) is, in essence, reduced by half.

Figure 13:
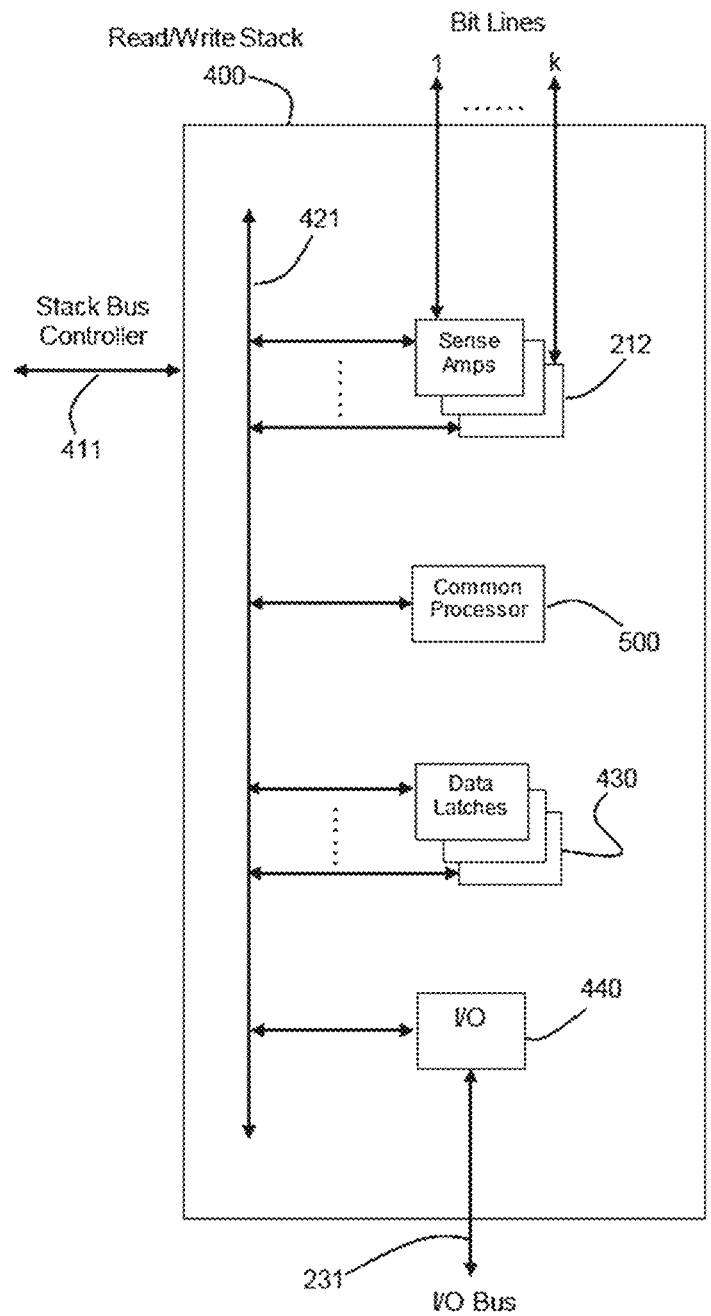
FIG. 13 schematically depicts various components of a read/write stack, such as the read/write stacks depicted in FIG. 12A, in accordance with exemplary embodiments.
Figure 14A:
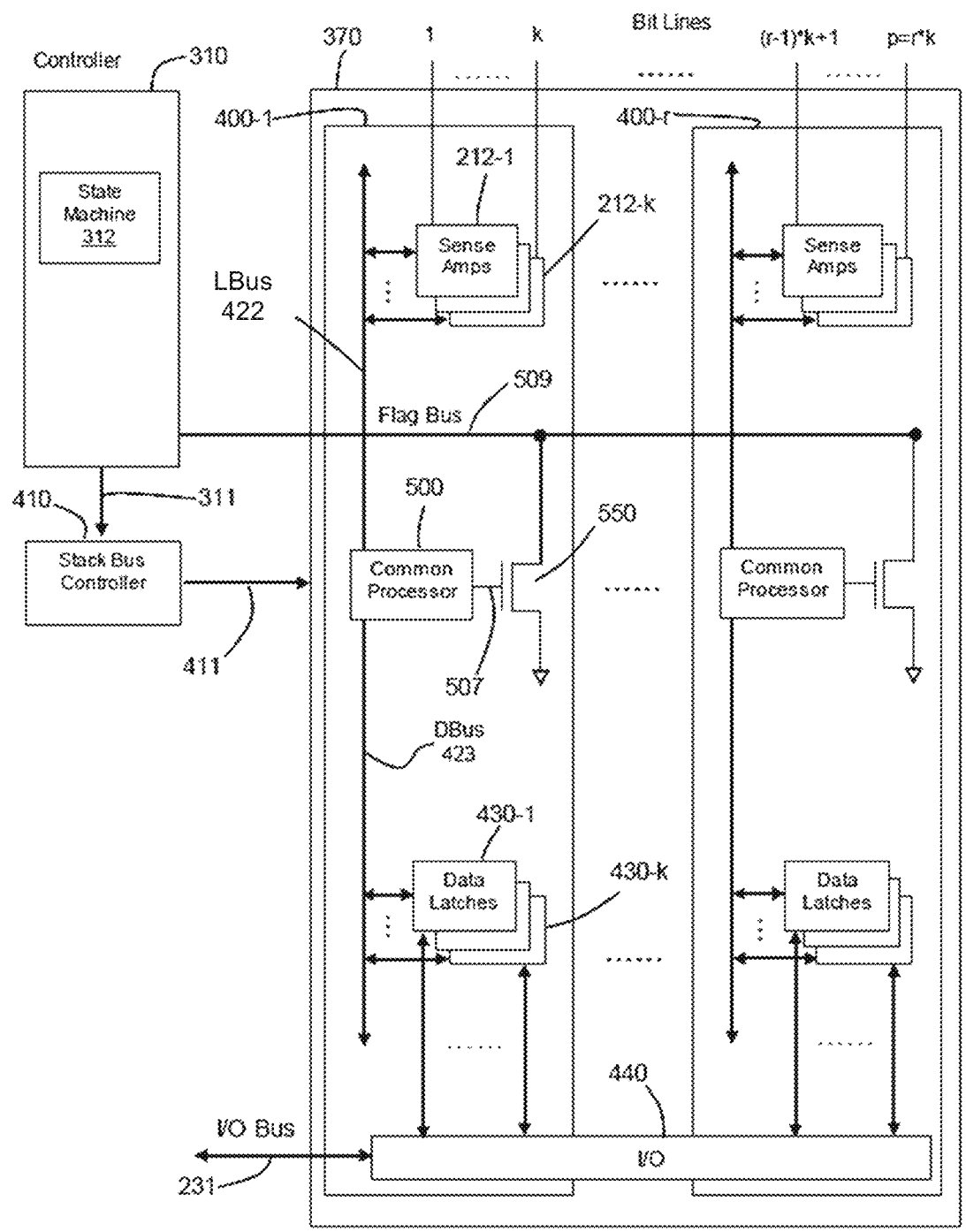
FIG. 14A schematically depicts a plurality of read/write stacks arranged amongst read/write circuits of a memory device, such as the memory device depicted in FIG. 12A, in accordance with exemplary embodiments.

Referring now to FIG. 13, there is illustrated an exemplary embodiment of certain components in a read/write stack, such as the read/write stacks 400 of FIG. 12A. According to this particular architecture, a read/write stack 400 comprises a stack of sense amplifiers 212 for sensing a "k" number of bit lines, an I/O module 440 for input or output of data over an I/O bus 231, a stack of data latches 430 for storing input and/or output data, a common processor 500 to process and store data among the read/write stack 400, and a stack bus 421 for communication among the read/write stack 400 components. In addition, a stack bus controller provides control and timing signals via lines 411 for controlling the various components of read/write stack 400. FIG. 14A depicts an exemplary embodiment for incorporating the read/write stack 400 of the embodiment of FIG. 13 amongst the read/write circuits 370 of the memory devices depicted in FIGS. 12A-12B. As indicated above, each of read/write stacks 400 operates on a group of "k" number bit lines in parallel. Therefore, if a page in memory array 300 has p=r*k bit lines, there will be a "r" number of read/write stacks—i.e., read/write stacks 400-1, . . . , 400-r. Accordingly, the entire bank of partitioned read/write stacks 400-1, . . . , 400-r, operating in parallel allows a block (or a page) of p cells along a row to be read or programmed in parallel, there being p read/write modules for the entire row of cells. As each read/write stack 400-1, . . . , 400-r serves "k" memory cells, the total number of read/write stacks in a bank may be expressed as r=p/k. Further, in accordance with this example, each read/write stack correspondingly has a stack of sense amplifiers 212-1, . . . , 212-k that serves a segment of "k" memory cells in parallel. In addition, each read/write stack correspondingly has a stack of data latches 430-1, . . . , 430-k, wherein each data latch is associated with a memory cell. As such, there is an I/O module 440 enabling data latches 430-1, . . . , 430-k to exchange data externally via an I/O bus 231.

Still referring to FIG. 14A, there is also shown a stack bus controller 410 that receives signals from the memory controller 310 (via lines 311) and in turn provides control and timing signals to the read/write circuits 370 via lines 411. Communication among the read/write stacks 400 is implemented by an interconnecting stack bus controlled by stack bus controller 410. Therefore, the control lines 411 provide control and clock signals from the stack bus controller 410 to the components of the read/write stacks 400-1, . . . , 400-r. In this particular example, the interconnecting stack bus is divided into a LBus (or Local Data Bus) 422 and a DBus (or Data Bus) 423, wherein LBus 422 provides for communication between the common processor 500 (which, according to certain embodiments, may be in the form of a detection circuit comprising one or more data latch transistors) and the stack sense amplifiers 212-1, . . . , 212-k, and DBus 423 provides a communication pathway between the common processor 500 and the stack of data latches 430-1, . . . , 430-k. With respect to common processor 500, it further comprises an output 507 for output of a status signal of a memory operation, such as an error condition. As depicted in FIG. 14A, this status signal may, for example, be used to drive a gate of a n-transistor 550 that is tied to a Flag Bus 509 in a Wired-Or configuration, wherein the Flag Bus 509 may be pre-charged by the controller 310 and is pulled down when a status signal is asserted by any of read/write stacks 400-1, . . . , 400-r.

Figure 14B:
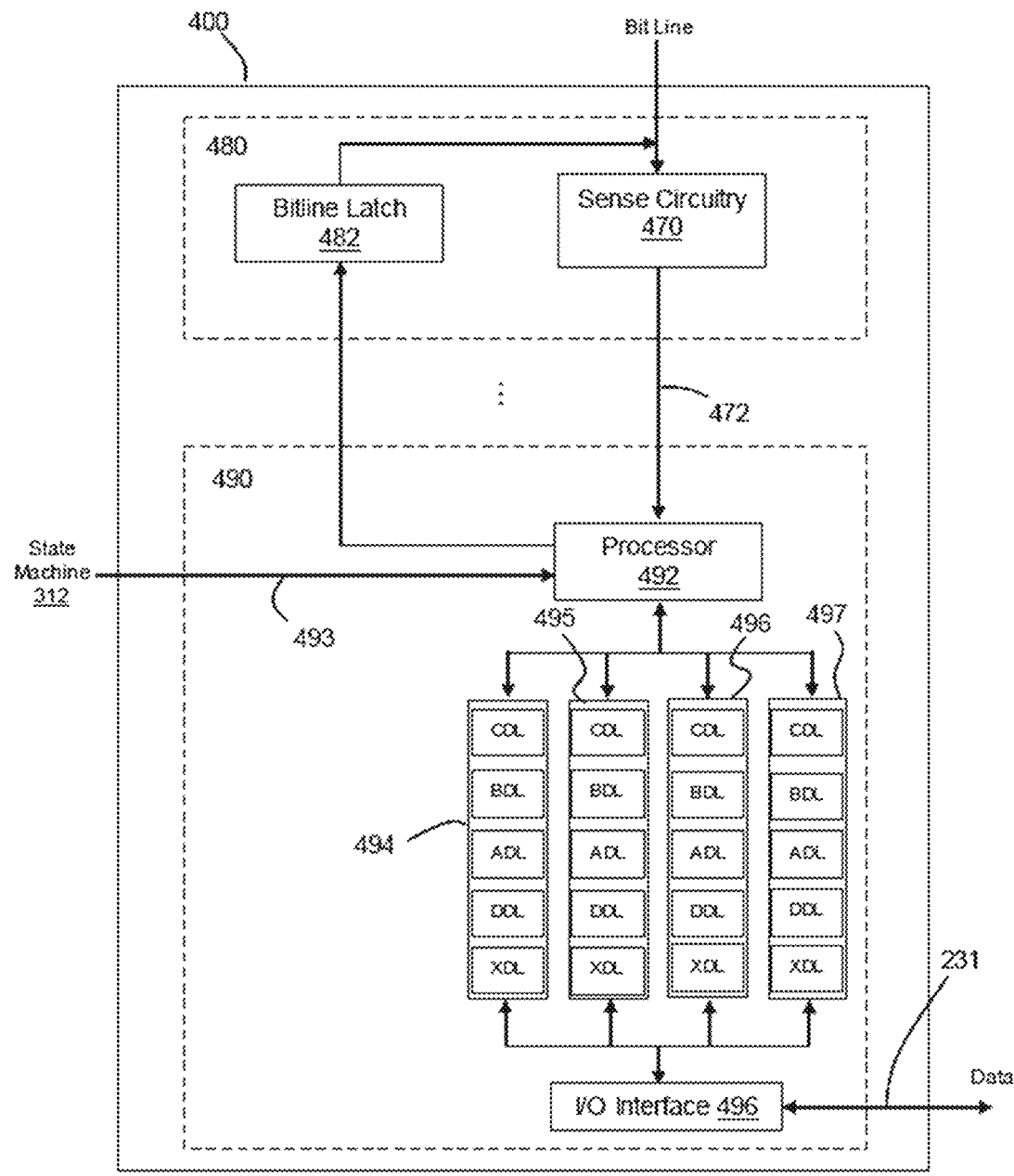
FIG. 14B is a block diagram depicting a sense block of a read/write stack, such as the read/write stacks depicted in FIG. 12A, in accordance with exemplary embodiments.

Further, an exemplary embodiment of an individual sense block (as encompassed by a read/write stack 400) is depicted in FIG. 14B. Sense block 400 is partitioned into one or more core portions comprising the sense modules 480 or sense amplifiers, and a common portion, referred to as a managing circuit 490. In one embodiment, there is a separate sense module 480 for each bit line and one common managing circuit 490 for a set of multiple, e.g., four or eight, sense modules 480. Each of the sense modules in a group communicates with the associated managing circuit via data bus 472. Thus, there are one or more managing circuits which communicate with the sense modules of a set of storage elements 10.

Sense module 480 comprises sense circuitry 470 that performs sensing by determining whether a conduction current in a connected bit line is above or below a predetermined threshold level. Sense module 480 also includes a bit line latch 482 that is used to set a voltage condition on the connected bit line. For example, a predetermined state latched in bit line latch 482 will result in the connected bit line being pulled to a state designating program inhibit (e.g., 1.5-3 V). As an example, a flag=0 can inhibit programming, while flag=1 does not inhibit programming.

In the exemplary embodiment of FIG. 14B, the managing circuit 490 comprises a processor 492, four example sets of data latches 494, 495, 496, and 497, and an I/O interface 496 coupled between the sets of data latches 494-497 and the data bus 231. One set of data latches may be provided for each sense module 480, and data latches identified by XDL, DDL, ADL, BDL, and CDL may be provided for each set. In some cases, additional data latches may be used. In one exemplary approach, in a memory device which uses eight data states, XDL stores user data, DDL stores an indication of whether quick pass write programming is used, ADL stores a lower page of data, BDL stores a middle page of data, and CDL stores an upper page of data.

Processor 492 performs computations, such as to determine the data stored in the sensed storage element and store the determined data in the set of data latches. Each set of data latches 494-497 is used to store data bits that are determined by processor 492 during a read operation, and to store data bits imported from the data bus 231 during a programming operation which represent write data that is meant to be programmed into the memory. The I/O interface 496 provides an interface between data latches 494-497 and the data bus 231.

During reading, the operation of the system is under the control of state machine 312 that controls the supply of different control gate voltages to the addressed storage element 10. As it steps through the various predefined control gate voltages corresponding to the various memory states supported by the memory, the sense module 480 may trip at one of these voltages and a corresponding output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494-497. In another embodiment of the managing circuit 490, the bit line latch 482 operates in a double duty capacity, both as a latch for latching the output of the sense module 480 and also as a bit line latch as described above.

During program or verify operations, the data to be programmed (write data) is stored in the set of data latches 494-497 from the data bus 231. The programming operation, under the control of the state machine 312, comprises a series of programming voltage pulses applied to the control gates of the addressed storage elements. Each program pulse is followed by a read back (verify) to determine if the storage element has been programmed to the desired memory state. In some cases, processor 492 monitors the read back memory state relative to the desired memory state. When the two are in agreement, the processor 492 proceeds to set the bit line latch 482 to cause the bit line to be pulled to a state designating program inhibit. This inhibits the storage element coupled to the bit line from further programming even if program pulses appear on its control gate. In other embodiments, the processor initially loads the bit line latch 482 and the sense circuitry sets it to an inhibit value during the verify process.

As mentioned, each set of data latches 494-497 may be implemented as a stack of data latches for each sense module. In one exemplary embodiment, there are three data latches per sense module 480. In some implementations, data latches are implemented according to a shift register so that the parallel data that is stored therein is converted to serial data for data bus 231, and vice versa. For example, all data latches corresponding to the read/write block of M storage elements can be linked together to form a block shift register so that a block of data can be input or output by serial transfer. In particular, the bank of read/write modules may be adapted in order that each of its set of data latches will shift data into or out of the data bus in sequence as if they are part of a shift register for the entire read/write block.

The data latches identify when an associated storage element 10 has reached certain mileposts in a programming operation. For example, latches may identify if a storage element's $V_{th}$ is below a particular verify level. Data latches indicate whether a storage element currently stores one or more bits from a page of data. For example, with respect to one exemplary embodiment, the ADL latch is flipped (e.g., from 0 to 1) when a lower page bit is stored in an associated storage element. Further, the BDL latch is flipped when a middle page bit is stored in an associated storage element. And the CDL latch is flipped when an upper page bit is stored in an associated storage element. A bit is stored in a storage element when the $V_{th}$ exceeds an associated verify level.

Figure 15:
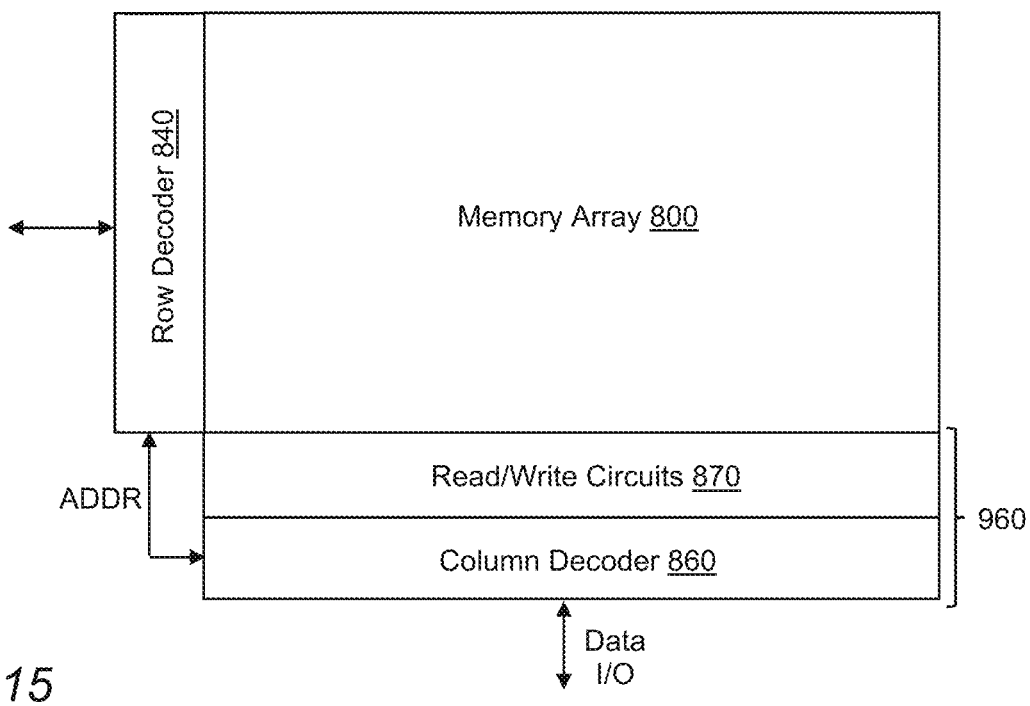
FIG. 15 schematically depicts an alternative configuration of a non-volatile memory array that is accessible by read/write circuits via row and column decoders, in accordance with exemplary embodiments.

Turning now to FIG. 15, there is depicted a further exemplary embodiment of a non-volatile memory array 800 that is accessible by read/write circuits 870. Similar to the memory array 200 of the embodiment of FIG. 10, the individual memory cells of memory array 800 are addressable via a set of selected word line(s) and bit line(s) by way of a row decoder 840 and column decoder 860. Accordingly, the row decoder 840 selects one or more word lines and the column decoder 860 selects one or more bit lines in order to apply the appropriate voltages to the respective gates of the addressed memory cells. Further, read/write circuits 870 are provided to read or write the memory states of the addressed memory cells, wherein read/write circuits 870 comprise a number of read/write modules connectable via bit lines to memory elements of the array 800. This particular configuration is one example for implementing the memory block structure 210 according to the embodiment depicted in FIGS. 6A and 6B.

Figure 16A:
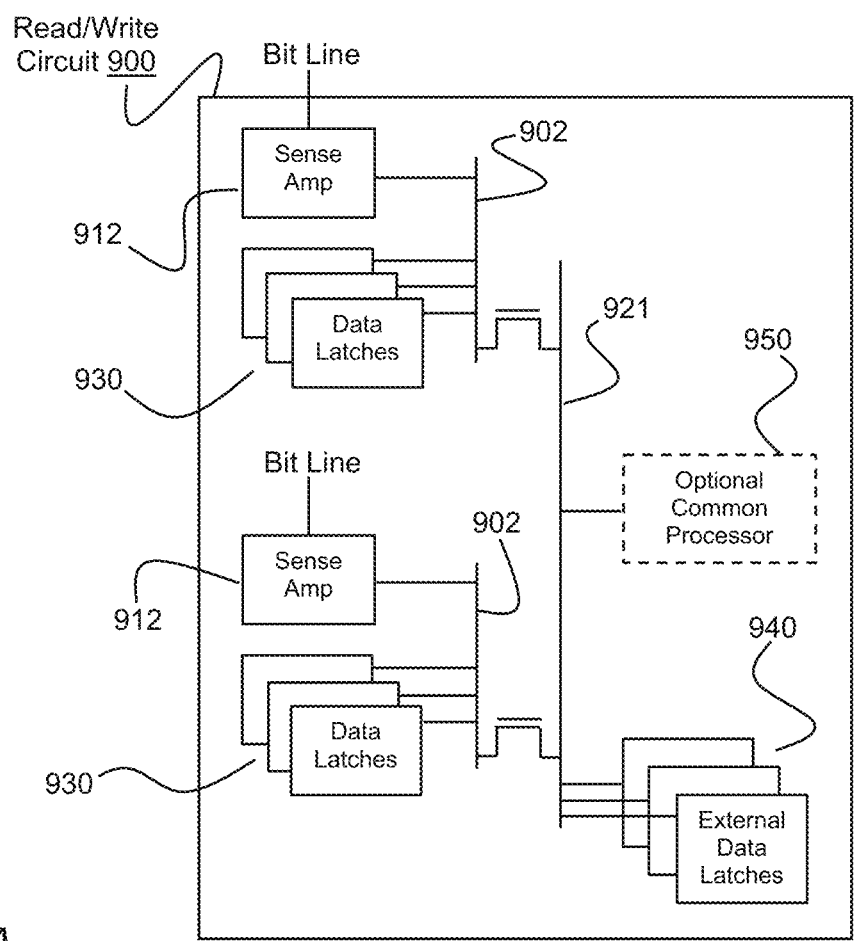
FIG. 16A schematically depicts various components of a read/write circuit, such as the read/write circuits depicted in FIG. 15, in accordance with exemplary embodiments.
Figure 16B:
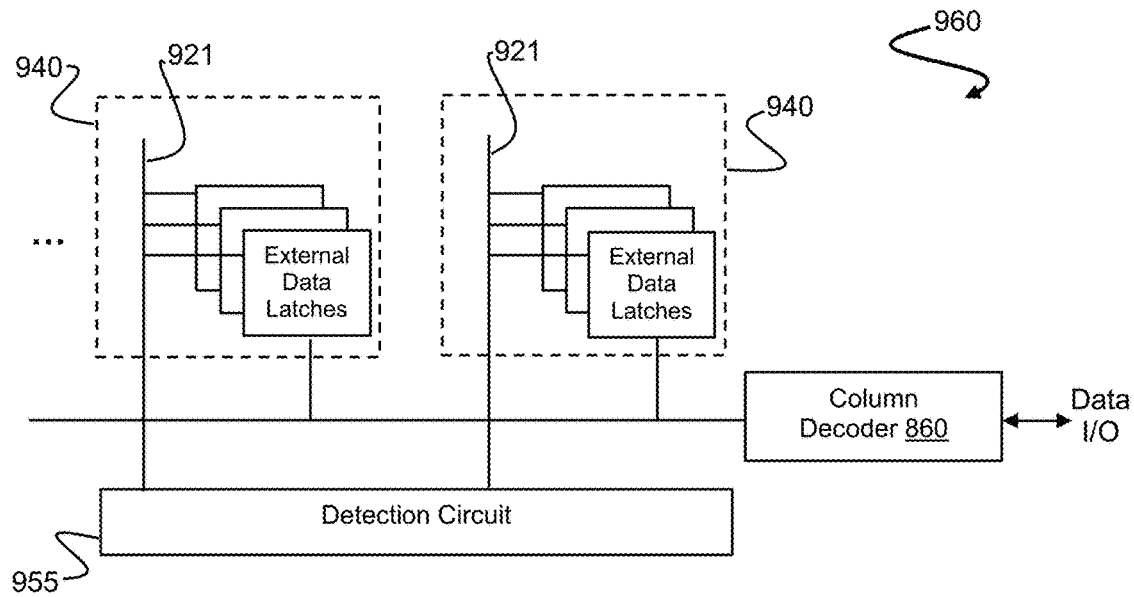
FIG. 16B schematically depicts, in greater detail, a portion of the read/write circuit of FIG. 16A, in accordance with exemplary embodiments.

Referring now to FIGS. 16A-16B, there is shown an exemplary embodiment of certain components of a read/write circuit, such as the read/write circuits 870 of FIG. 15, illustrated with respect to a segment of bit lines (BL) of a memory array 800. According to this particular architecture, a read/write circuit 900 may comprise one or more read/write modules, with each module comprising a sense amplifier 912 for sensing one of a "p" number of bit lines (e.g., according to an "all bit-line scheme"), a stack of data latches 930 for storing input and/or output data, and a local bus 902 connecting the data latches 930 to sense amplifier 912. Further, the read/write circuit 900 may comprise a data bus 921 for communications between the read/write modules, wherein the data bus 921 may be connected to a common processor 950 and an external set of data latches 940. Specifically, common processor 950 and external data latches 940 may process and store data among the read/write modules, as well as provide the control and timing signals to the various components of the read/write circuit 900. In addition, FIG. 16B is a schematic diagram of an embodiment of the circuitry portion 960 comprising the read/write circuits 870 and the column decoder 860 of, for example, the memory array 800 of FIG. 15. Accordingly, in the particular embodiment shown in FIGS. 16A-16B, the logic operations are performed using data bus 921 and the transistors of the external set of data latches 940, and as implemented by the common processor 950. Further, a detection circuit 950 may be associated with each plane of the memory array 800, such that feedback from the detection circuit 950 is relayed to a state machine (e.g., via, for example, the Flag Bus 509 to the state machine 312 of FIG. 14A).

Figure 17:
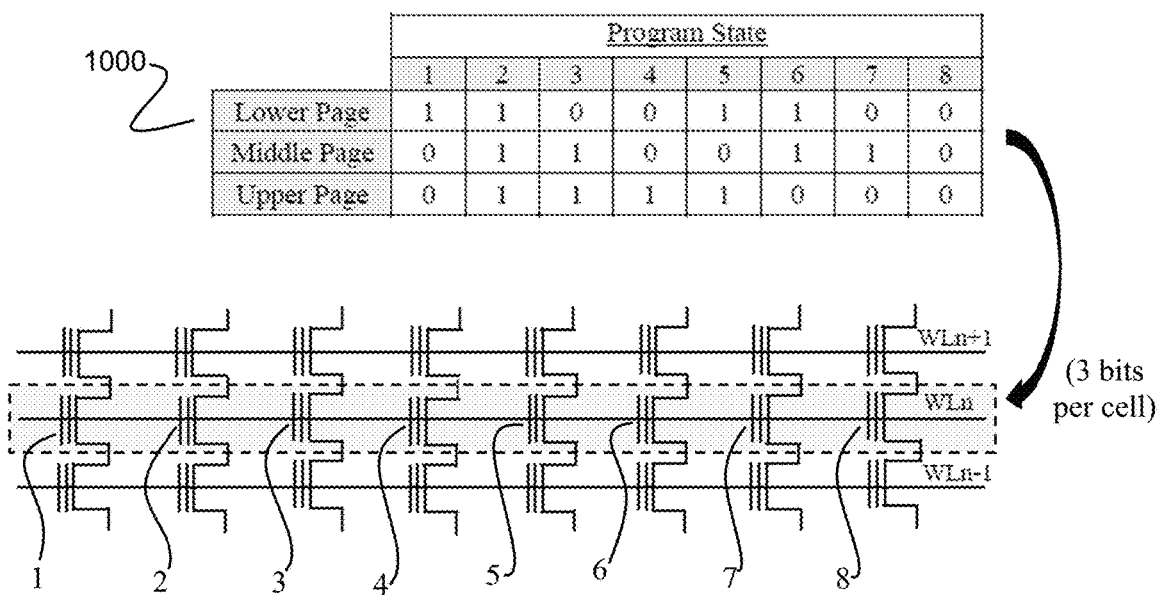
FIG. 17 illustrates a TLC programming operation, in accordance with exemplary embodiments.
Figure 18:
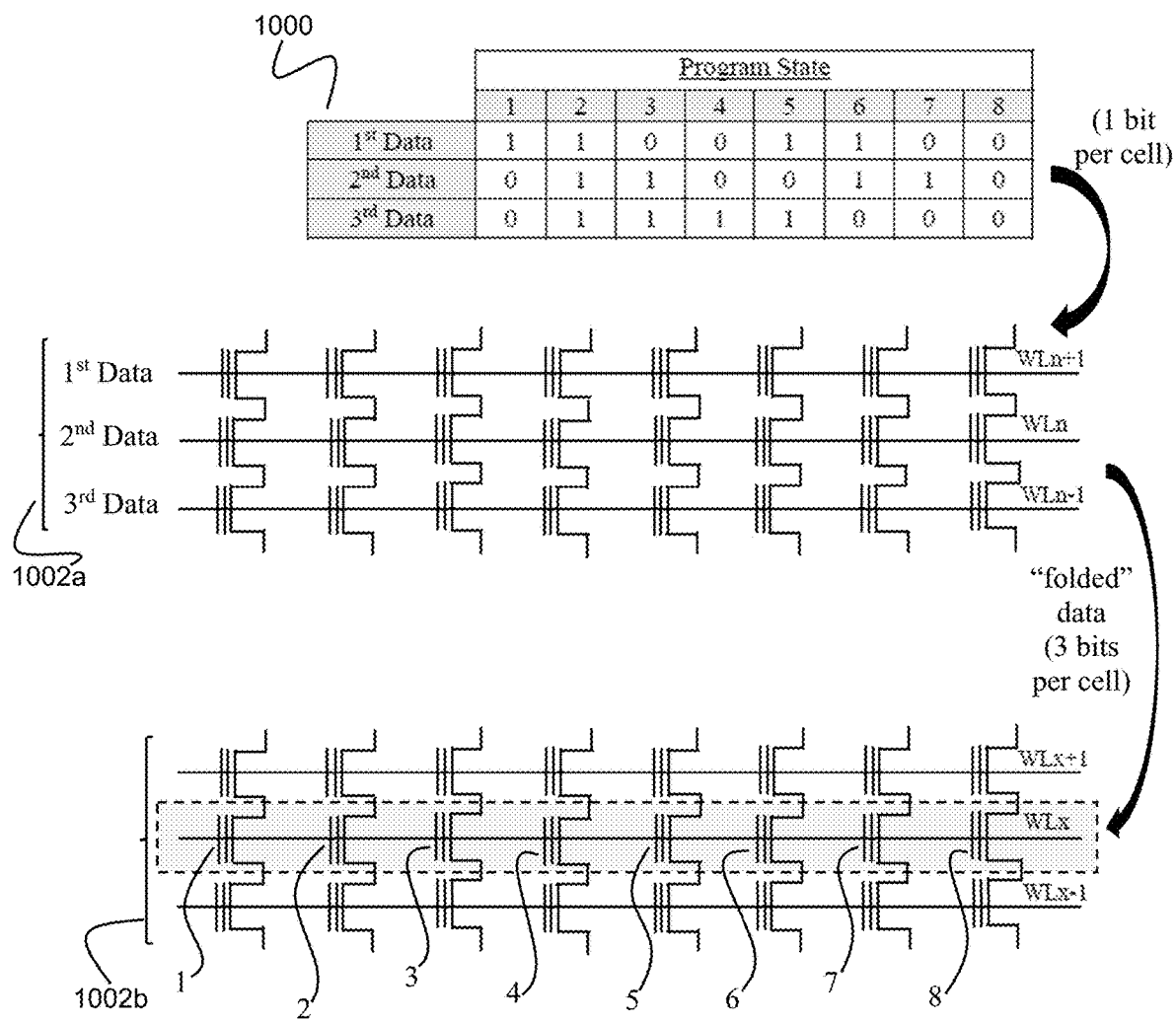
FIG. 18 illustrates an internal folding process during a programming operation, in accordance with exemplary embodiments.

The above discussion describes just several non-limited embodiments of non-volatile memory systems and devices. Any of these systems and devices, as well as other exemplary embodiments, can, as previously mentioned, operate in both binary forms (SLC) and multi-state or multi-level (MLC or TLC) forms. For example, as data can be written or programmed faster and with less critical tolerances (i.e., with greater reliability) in binary form in comparison to a multi-state form, a memory device may be configured to initially program data in binary form as it is being received from a host and then at a subsequent time, rewrite the data in a multi-state format to take advantage of the greater storage density. Therefore, in these types of memory devices, some memory cells may be used in a single-state form and other memory cells may be used in a multi-state form, or the same cells may be operated to store differing numbers of bits. The process for rewriting data from a binary format into a multi-state format is referred to as "folding." According to an exemplary embodiment of a folding process, data is initially transferred from the memory controller (e.g., controller 310) to the memory, written along word lines of the memory array (e.g., array 300) in a binary format. For example, in a multi-state form of three bits per cell, the content of three word lines would each be read into the corresponding registers, rearranged to correspond to the three bits that will be stored in each cell, and rewritten back to a single word line of the memory array in a three-bit per cell format. This scenario is illustrated using a comparison between the distinct programming processes that are shown in FIGS. 17 and 18. FIG. 17 depicts an exemplary embodiment of a straightforward TLC programming process in which a three-page set of data 1000, which is comprised of eight programming states (1 through 8), is programmed into a single word line (e.g., "WLn," wherein "n" is any integer 0 or higher). Accordingly, the three bits of each programming state (i.e., the lower page, middle page, and upper page bits) are programmed into a single memory cell of the selected word line such that each memory cell is programmed according to one of the eight programming states (1, 2, 3, 4, . . . , 8). Therefore, using this TLC programming scheme, the effective storage density is increased threefold in comparison to a binary SLC programming scheme in which each memory cell stores just one bit. However, as mentioned above, a consequence of the increased complexity in a multi-state programming process is a slower programming time when compared to a SLC programming process. In fact, under certain conditions, a TLC programming process may require approximately three times the amount of time needed to otherwise program the same amount of data according to a SLC or MLC programming scheme. Therefore, as described above, one exemplary approach for overcoming this negative performance effect is to employ a "folding" scheme, which is a hybrid two-stage solution that utilizes, for example, both the single-state and multi-state programming schemes. Depicted in FIG. 18 is one exemplary embodiment of a folding scheme in which the three-page data set 1000 is, in a first stage 1002a, programmed according to a binary SLC programming scheme such that each page (referred to as $1^{st}$ Data, $2^{nd}$ Data, and $3^{rd}$ Data in FIG. 18) is programmed along its respective word line (see e.g., WLn+1, WLn, and WLn−1) at one bit per cell. Subsequently, in a second stage 1002b, the binary programmed data from the first stage is packed according to three bits per cell of a single selected word line (see e.g., WLx) in a TLC programming process according to the internal operation of the memory system.

Figure 19:
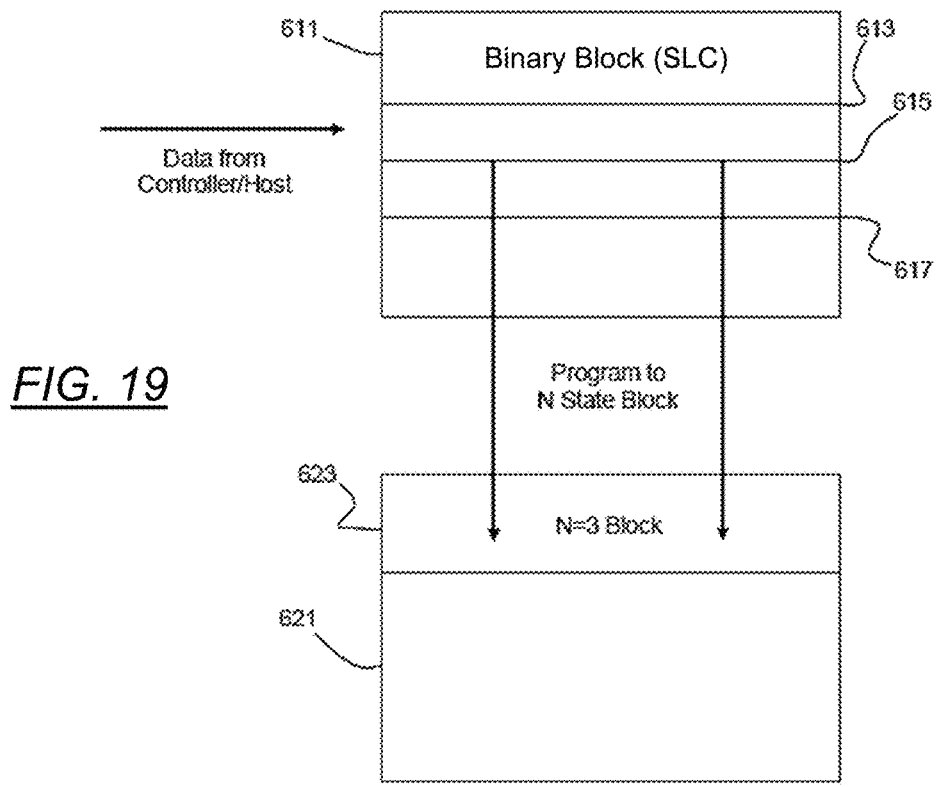
FIG. 19 illustrates an on-memory folding process in which the data from multiple word lines in a binary format is rewritten into a multi-state format, in accordance with exemplary embodiments.
Figure 20:
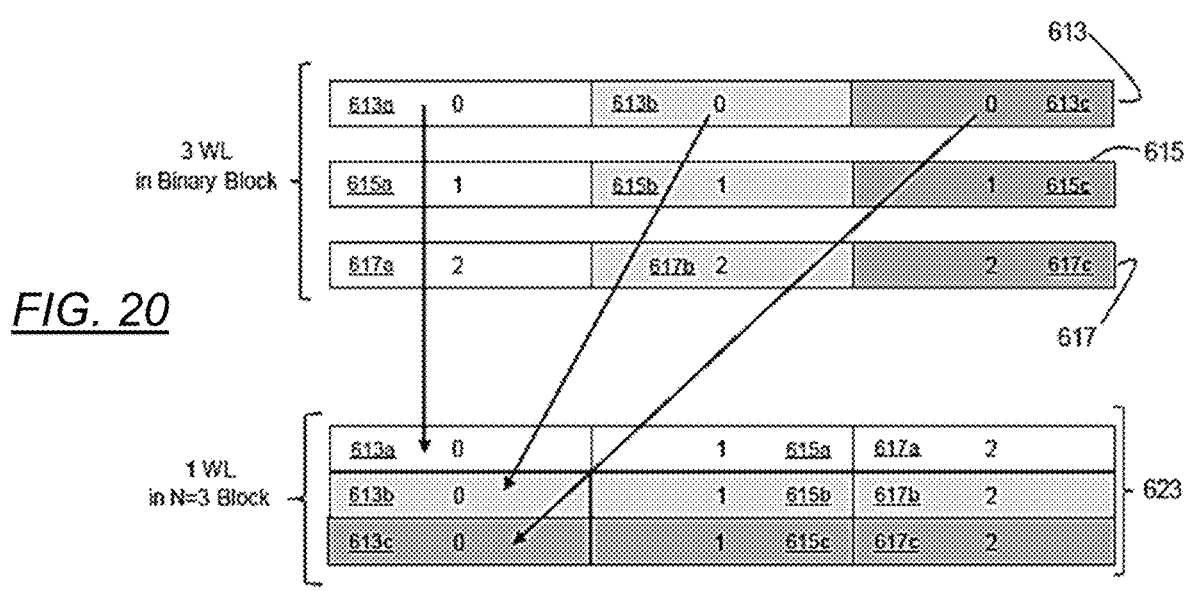
FIG. 20 illustrates aspects of the folding process of FIG. 19 in greater detail, in accordance with exemplary embodiments.

Referring now to FIG. 19, there is shown an exemplary embodiment of an on-memory folding process that may be employed in, for example, the programming memory operation described above with respect to FIG. 18. As indicated, data is received from a controller or host and is initially programmed in binary format (SLC) along an "N" number of word lines of a representative memory block 611. Thereafter, the content of the "N" word lines is rewritten in a multi-state (MLC) "N"-bit per cell format along a single word line of another representative memory block 621, wherein this "folding" process is accomplished on the memory itself. In this particular example, three word lines (613, 615, 617) of the binary formatted block 611 undergo the folding process and are rewritten along a single word line 623 of the multi-state three-bit per cell formatted block 621 (i.e., N=3). Block 611 may be specifically assigned to operate in only binary mode or may be a block operable in MLC mode by, for example, having just the lowest page of multiple logical pages be storable on a physical page. Similarly, block 621 may be assigned for only the multi-state operation or may be operable in binary mode as well. FIG. 20 depicts an exemplary embodiment of the rearrangement and rewriting of data in the example folding process shown in FIG. 19, wherein the three binary word lines in binary format are subsequently folded into a single multi-state word line. Accordingly, at the top of FIG. 20 are three binary state word lines 613, 615, and 617, wherein each word line is divided into, for example, three parts a, b, and c, each segment containing a third of the memory cells along the corresponding a third of the bit lines (here taken as contiguous). Further, at the bottom of FIG. 20 is the multi-state word line 623 in which the three parts 613a-c of the first word line 613 are subsequently folded and written into a first third of word line 623, the three parts 615a-c of the second word line 615 are thereafter folded and written into a second third of word line 623, and lastly, the three parts 617a-c of the third word line 617 are folded and written into a final third of word line 623. Importantly, although the exemplary embodiments of FIGS. 19 and 20 show the case in which there are three pages of data rewritten from three physical pages into a multi-state format on a single physical page, other numbers of storage densities can be used. Additionally, although entire word lines (each here corresponding to a page) are shown, in a memory system that allows partial page operation, partial pages may be used. Finally, while FIG. 20 highlights the case in which memory cells along a word line are divided into segments along contiguous bit lines, other arrangements can be used.

As indicated above, the folding process is performed on the memory itself such that received data from the host does not need to first be transferred off the memory before it can be rewritten into a memory array in the multi-state format. This ability can be implemented by, for example, reading the data of the multiple binary state word lines (e.g., 613, 615, 617) into corresponding registers (or latches) associated with the memory array, rearranged within these registers into the form needed for multi-state programming, and then rewritten into a single word line (e.g., 623) of a multi-state memory block. Accordingly, in the embodiment shown in FIGS. 19 and 20, the binary content of several memory cells (three, specifically) on the same word line, but along different bit lines, are read into the associated data registers or latches, and then rearranged to correspond to the multi-bits of a single cell on a corresponding single bit line from where it can be written.

Although the "folding" process, through the conjunction of an initial binary (SLC) programming stage and a second multi-state (MLC, TLC, or QLC) rewriting stage, provides the dual benefits of relatively faster programming speed and a greater storage capacity or density, a disadvantage lies in the fact that the process requires at least two stages rather than just a single stage, thereby adding complexity and a consequential amount of time to the processing speed. Therefore, it would be advantageous to be able to further optimize either or both of the programming and rewriting stages of a folding process. FIGS. 21A-21D depict an exemplary embodiment of a mechanism for improving the speed and efficiency of the initial binary (SLC) programming stage of a folding process. According to this particular embodiment, the initial programming stage of the folding operation may comprise the writing of, for example, a three-page data set (e.g., the data set 1000 of FIGS. 17 and 18) along two word lines (WL) of two memory cell strings of a memory block using two SLC programming operations, wherein the memory cells belonging to a common word line (WL) of the two strings are programmed simultaneously. In the case of the memory structure embodiment of FIGS. 6A-6B, the two memory cell strings may be adjacent. However, the two cell strings may not be adjacent with respect to, for example, the memory structure embodiment of FIGS. 4A-4B and 5. As illustrated in FIGS. 21A-21D, by varying the bit line voltage ($V_{BL}$) and control gate voltage at the select transistors (SGD1 and SGD2) of each of the two adjacent cell strings (1010 and 1012) pictured, the number of resulting combinations or iterations make it possible to program the memory structure to represent three distinct bit values.

Figure 21A:
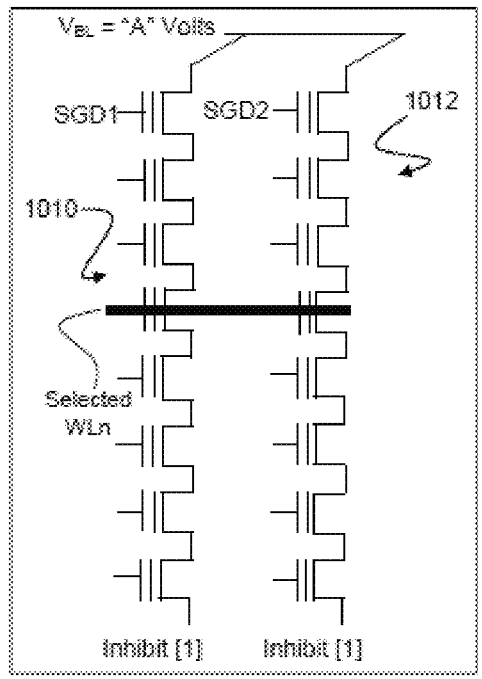
FIGS. 21A-21D illustrate an exemplary process for a three-page data set SLC programming operation in which two memory strings are simultaneously written to along a common word line, in accordance with exemplary embodiments.

FIG. 21A illustrates a first programming pattern in which the respective control gate voltages, i.e., SGD1 and SGD2, of a first cell string 1010 and a second cell string 1012, respectively, are set at a pre-determined voltage level (e.g., SGD1=1.5 V; SGD2=1.0 V) and the bit line voltage ($V_{BL}$) is simultaneously applied at "A" volts at both the first and second strings, such that an "Inhibit" condition is generated with respect to the memory cells of a selected word line (WLn) that is common to both strings. In other words, the application of "A" volts is such that the voltage difference between the control gate voltages, SGD1 and SGD2, and the bit line voltage ($V_{BL}$) (i.e., "A" volts) is sufficiently low such that the two select transistors are in an OFF state and, as a result, both of the memory cell strings 1010 and 1012 are in an "Inhibit" condition. For purposes of this particular example, the bit line voltage ($V_{BL}$) "A" may be equal to 2.0 V. As such, a (1, 1) bit data value may be represented by this specific programming scheme.

Figure 21B:
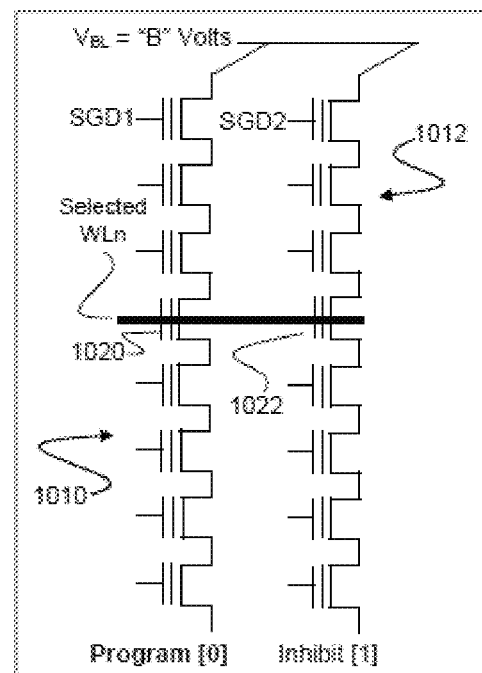

In FIG. 21B, there is shown a second programming pattern in which, given the pre-determined voltages (SGD1, SGD2) at the select transistors, the bit line voltage ($V_{BL}$) is simultaneously applied to both the first and second strings 1010, 1012 at a voltage level "B", wherein the voltage difference between the control gate voltages, SGD1 and SGD2, and the bit line voltage ($V_{BL}$), is such that the select transistor (SGD1) of the first string 1010 is effectively switched to an ON state (generating a "Program" condition at a memory cell 1020 that is located at the common word line (WLn)) and the select transistor (SGD2) remains in an OFF state, maintaining an "Inhibit" condition (at a memory cell 1022 located at the common word line (WLn)). Given this particular example, the bit line voltage ($V_{BL}$) "B," which is an intermediate voltage between voltages "A" and "C" (see discussion of FIG. 21C below), and may be equal to, for example, 0.7 V. As a result, a (0, 1) bit data value may be represented by this specific programming scheme.

Figure 21C:
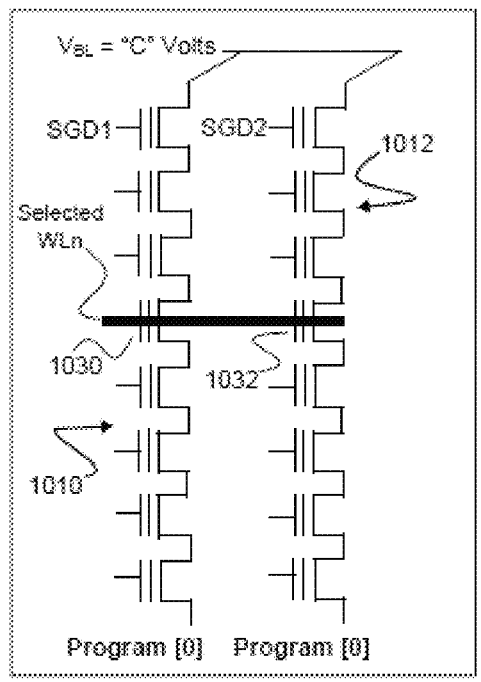

With respect to FIG. 21C, there is depicted a third programming pattern in which, again, given the pre-determined gate voltages (SGD1, SGD2) at the first and second string select transistors, the bit line voltage ($V_{BL}$) is applied at "C" volts to both the first and second strings 1010, 1012 simultaneously, such that both strings are turned to an ON state. As a result, the memory cells (1030, 1032) of the first and second strings, respectively (located at common selected word line (WLn)), experience a "Program" condition. For purposes of this particular example, the bit line voltage ($V_{BL}$) "C" may be equal to, for example, zero volts (VSS). Accordingly, a (0, 0) bit data value may be represented by this specific programming scheme.

Figure 21D:
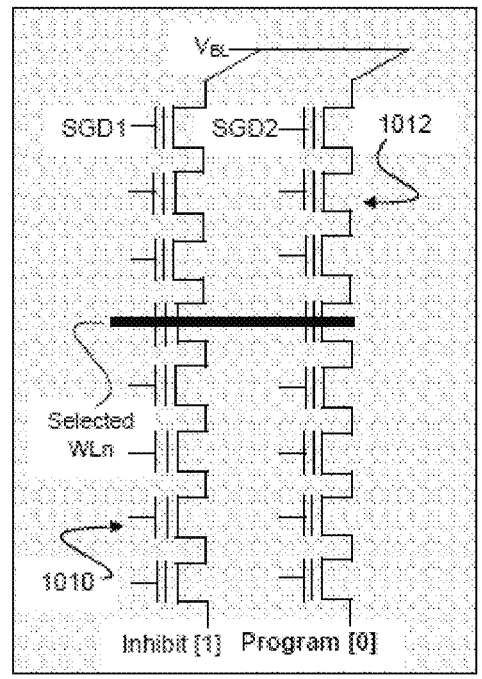

The final iteration of bit data values is conceivably a (1, 0) pattern. This pattern is illustrated in FIG. 21D. However, because the gate voltages (SGD1, SGD2) are pre-determined and cannot be varied during a programming operation, there is no possible selectable bit line voltage ($V_{BL}$) level in order to produce an "Inhibit" condition at the first string 1010 and a "Program" condition at the second string 1012 to effectuate the (1, 0) bit data value. Therefore, the SLC programming mechanism described herein may be referred to as a "three-value" programming scheme.

Figure 22:
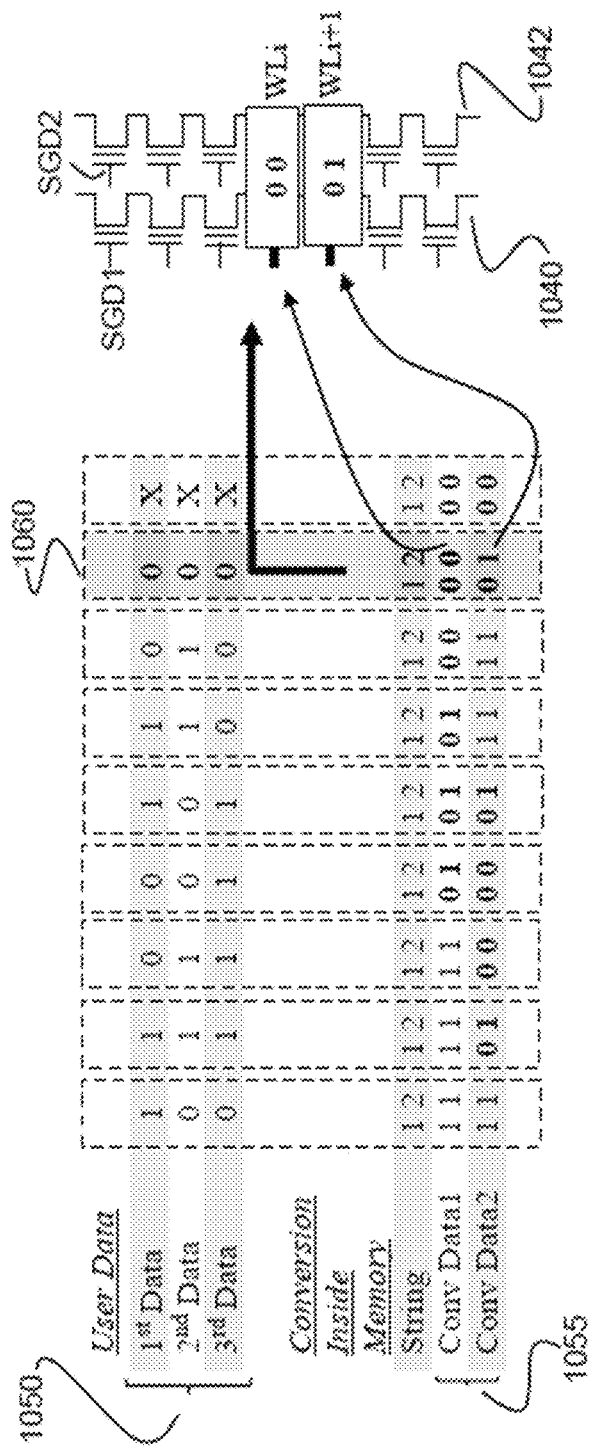
FIG. 22 illustrates a process for converting a three-page data set into a set of representative two-bit data values in order to be programmed according to the process of FIGS. 21A-21D, in accordance with exemplary embodiments.

Referring now to FIG. 22, there is illustrated an exemplary embodiment of a process for programming an example three-page data set 1050 using the two-string simultaneous SLC programming mechanism described above with respect to FIGS. 21A-21D. For purposes of illustration, FIG. 22 focuses specifically on the host or user data value example case having the pattern (0, 0, 0) (see 1060). In an initial step, the three-page data set 1050 must algorithmically converted within the memory system such that each data pattern of the three-page data set is represented by a set (1055) of two bit data values that may be written to a two-string scheme according to the programming mechanism just described immediately above. Specifically, each pattern of the three-page data set (1050) must be correspondingly assigned a representative two-bit data value or values using only the three possible bit data values of (0, 0), (0, 1), and (1, 1). Accordingly, with respect to the example case of the three-page data pattern (0, 0, 0), it may be converted to, for example, the combination of the two-bit data values of (0, 0) and (0, 1) (as depicted in FIG. 22), wherein the "1" bit data value thereby corresponds to the low threshold voltage ($V_{th}$) condition and, as such, the "0" bit data value corresponds to the high threshold voltage ($V_{th}$) condition. Subsequently, the converted data patterns (0, 0) and (0, 1) may be simultaneously written to two adjacent memory cell strings (1040 and 1042) at the selected common word lines (i.e., WLi and WLi+1). Therefore, using this two-string programming approach and combining the two word lines (WLi and WLi+1), a three-page data set (e.g., set 1050) may be adequately represented, and subsequently programmed, according to the nine conversion combinations (1055) set forth in FIG. 22.

According to certain exemplary embodiments, such a conversion can be implemented using a data latch scheme. For example, to first store the three-page user data 1050, a $1^{st}$, $2^{nd}$, and $3^{rd}$ data may be stored in data latches ADL, BDL, and CDL, respectively. In a second step, a common processor (e.g., 500) attached to a data bus, and/or in conjunction with transistors comprised of an external set of data latches, may perform the necessary logical operations to convert the user data 1050 to the converted two-bit data value representations 1055, which converted data 1055 may be stored using, for example, data latches ADL, BDL, CDL, and DDL, as needed. Finally, the stored converted data is then used to determine the bit-line levels as described above with respect to FIGS. 21A-21D.

Referring back to the exemplary embodiment depicted in FIGS. 21A-21D, an apparent challenge arises with respect to the ability to perform the necessary verify step during the programming operation as existing configurations cannot verify multiple memory strings along the same word line concurrently at the same time. However, upon careful inspection, this programming scheme, in actuality, provides a predictive mechanism that, based upon the verify result of the voltage distribution of just the first string alone, it is then possible to summarily determine the voltage distribution of the second string, in the two-string programming scheme discussed above. Specifically, in the programming condition that is exhibited in FIG. 21A, here first string 1010 is in the OFF state and, therefore, it can be axiomatically determined that the second string 1012 is also in the OFF state based upon the fact that the two cells are located in relatively close physical proximity and have similar physical shape and characteristics. Further, with respect to the programming condition that is exhibited in FIG. 21B, a conventional verify operation will suffice due to the fact that the second string 1012 is in the OFF state (i.e., in the "Inhibit" condition) and, therefore, does not necessitate a verify operation. In addition, with respect to the programming condition exhibited in FIG. 21C, a verify operation reveals that the first string 1010 is in the ON state (i.e., in the "Program" condition). As such, it can be assumed that the voltage distribution across the second string 1012 is also similarly in the ON state, based upon the available possibilities as outlined above with respect to FIGS. 21A-21D and 22.

Figure 23:
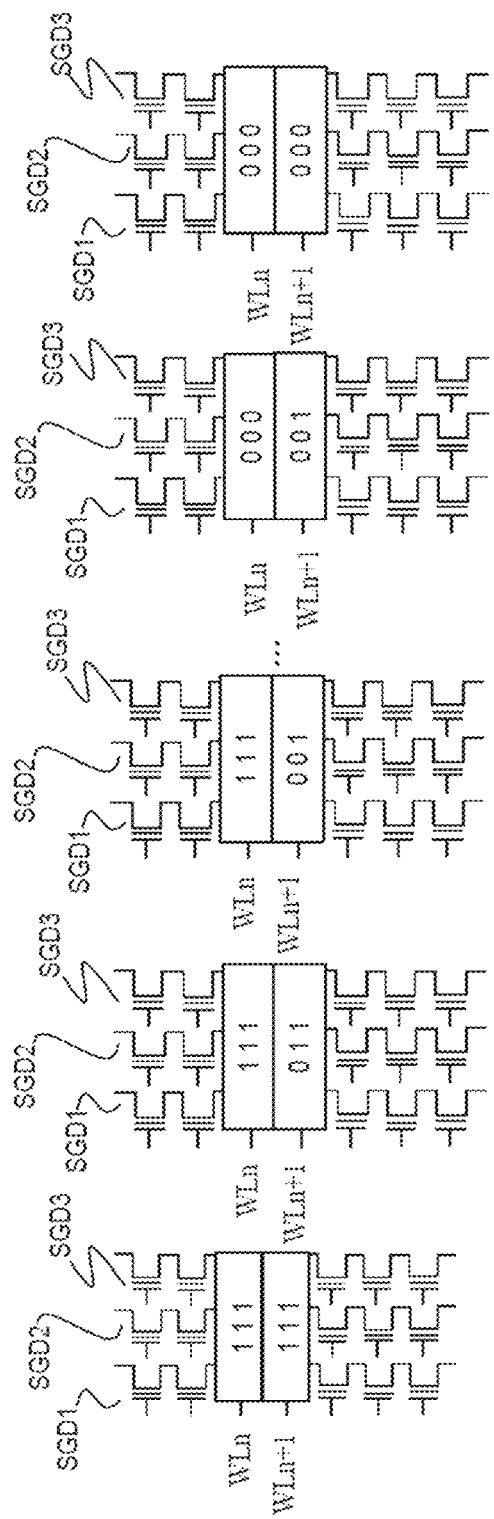
FIG. 23 illustrates an exemplary process for a four-page data set SLC programming operation in which three memory strings are simultaneously written to along two common word lines, in accordance with exemplary embodiments.

The multi-string simultaneous SLC programming mechanism described above is not limited to the programming of three-page host or user data. Rather, this basic underlying mechanism of performing multiple SLC programming operations simultaneously across two common word lines (WL) of more than one memory cell string can be adapted for data sets of higher storage density. For example, FIG. 23 depicts an exemplary embodiment of the SLC programming mechanism as adapted for programming four-page host or user data in an internal folding process in which the resulting converted data is stored in a QLC format. Accordingly, in order to provide a sufficient number of possible iterations or combinations of converted bit data values to entirely cover the originating four-page host or user data bit values, it is necessary to apply a SLC programming protocol simultaneously across two common word lines of three adjacent memory strings (SGD1, SGD2, and SGD3), as shown in FIG. 23.

The above discussion is meant to be illustrative of the principles and various embodiments of the present invention. Numerous variations and modifications will become apparent to those skilled in the art once the above disclosure is fully appreciated. For example, although on-memory controllers have been described as performing or controlling the methods that are described above, any processor executing software within a host system can perform the methods described above without departing from the scope of the disclosure. In particular, the methods and techniques described herein as performed in the on-memory controller(s), may also be performed in a host. Furthermore, the methods and concepts disclosed herein may be applied to other types of persistent memories other than flash. It is intended that the following claims be interpreted to embrace all such variations and modifications.

What is claimed is:

1. A method for programming a three page set of data in a memory array of a non-volatile memory system, comprising:
   converting each three-bit value data pattern of a three page set of user data into a representative pair of two-bit data values;
   simultaneously programming two single-state memory cells with a first of the pair of representative two-bit data values, wherein the two single-state memory cells are located along a first common word line of two memory cell strings; and
   simultaneously programming two single-state memory cells with a second of the pair of representative two-bit data values, wherein the two single-state memory cells are located along a second common word line of the two memory cell strings.

2. The method according to claim 1, wherein the programming of the first and second of the pair of representative two-bit data values occurs simultaneously.

3. The method according to claim 1, wherein:
   the two memory cell strings are located adjacent to one another; and
   the programming of the single-state memory cells comprises varying a bit line voltage applied to the two adjacent memory cell strings.

4. The method according to claim 1, wherein the programming of the single-state memory cells comprises applying a bit line voltage to the two memory cell strings such that:
   a first of the two memory cell strings is in an OFF state; and
   a second of the two memory cell strings is in an OFF state.

5. The method according to claim 1, wherein the programming of the single-state memory cells comprises applying a bit line voltage to the two memory cell strings such that:
   a first of the two memory cell strings is in an ON state; and
   a second of the two memory cell strings is in an OFF state.

6. The method according to claim 1, wherein the programming of the single-state memory cells comprises applying a bit line voltage to the two memory cell strings such that:
   a first of the two memory cell strings is in an ON state; and
   a second of the two memory cell strings is in an ON state.

7. The method according to claim 1, wherein the two-bit data values are one of:
   1, 1;
   0, 1; and
   0, 0.

8. The method according to claim 1, wherein the single-state memory cells are NAND-type memory cells.

9. A memory controller, comprising:
   a first port configured to couple to a non-volatile memory structure, the memory structure comprising a memory array; and
   the memory controller configured to:
      convert each three-bit value data pattern of a three page set of user data into a representative pair of two-bit data values;
      simultaneously program two single-state memory cells with a first of the pair of representative two-bit data values, wherein the two single-state memory cells are located along a first common word line of two memory cell strings of the memory array; and
      simultaneously program two single-state memory cells with a second of the pair of representative two-bit data values, wherein the two single-state memory cells are located along a second common word line of the two memory cell strings.

10. The memory controller according to claim 9, wherein the first and second of the pair of representative two-bit data values are simultaneously programmed.

11. The memory controller according to claim 9, wherein:
    the two memory cell strings are located adjacent to one another; and
    the single-state memory cells are programmed by varying a bit line voltage applied to the two adjacent memory cell strings.

12. The memory controller according to claim 9, wherein the single-state memory cells are programmed by applying a bit line voltage to the two memory cell strings such that:
    a first of the two memory cell strings is in an OFF state; and
    a second of the two memory cell strings is in an OFF state.

13. The memory controller according to claim 9, wherein the single-state memory cells are programmed by applying a bit line voltage to the two memory cell strings such that:
    a first of the two memory cell strings is in an ON state; and
    a second of the two memory cell strings is in an OFF state.

14. The memory controller according to claim 9, wherein the single-state memory cells are programmed by applying a bit line voltage to the two memory cell strings such that:
    a first of the two memory cell strings is in an ON state; and
    a second of the two memory cell strings is in an ON state.

15. A non-volatile memory system, comprising:
    a memory array;
    a memory controller coupled to the memory structure and:
       converting each three-bit value data pattern of a three page set of user data into a representative pair of two-bit data values;
       simultaneously programming two single-state memory cells with a first of the pair of representative two-bit data values, wherein the two single-state memory cells are located along a first common word line of two memory cell strings of the memory array; and
       simultaneously programming two single-state memory cells with a second of the pair of representative two-bit data values, wherein the two single-state memory cells are located along a second common word line of the two memory cell strings.

16. The non-volatile memory system according to claim 15, wherein the first and second of the pair of representative two-bit data values are simultaneously programmed.

17. The non-volatile memory system according to claim 15, wherein:
   the two memory cell strings are located adjacent to one another; and
   the single-state memory cells are programmed by varying a bit line voltage applied to the two adjacent memory cell strings.

18. The non-volatile memory system according to claim 15, wherein the single-state memory cells are programmed by applying a bit line voltage to the two memory cell strings such that:
   a first of the two memory cell strings is in an OFF state; and
   a second of the two memory cell strings is in an OFF state.

19. The non-volatile memory system according to claim 15, wherein the single-state memory cells are programmed by applying a bit line voltage to the two memory cell strings such that:
   a first of the two memory cell strings is in an ON state; and
   a second of the two memory cell strings is in an OFF state.

20. The non-volatile memory system according to claim 9, wherein the single-state memory cells are programmed by applying a bit line voltage to the two memory cell strings such that:
   a first of the two memory cell strings is in an ON state; and
   a second of the two memory cell strings is in an ON state.

* * * * *